(12) United States Patent
Utsumi

(10) Patent No.: US 10,832,776 B2
(45) Date of Patent: Nov. 10, 2020

(54) SEMICONDUCTOR DEVICE AND SEMICONDUCTOR MEMORY DEVICE

(71) Applicant: Toshiba Memory Corporation, Minato-ku (JP)

(72) Inventor: Tetsuaki Utsumi, Yokohama (JP)

(73) Assignee: Toshiba Memory Corporation, Minato-ku (JP)

(*) Notice: Subject to any disclaimer, the term of this patent is extended or adjusted under 35 U.S.C. 154(b) by 0 days.

(21) Appl. No.: 16/535,334

(22) Filed: Aug. 8, 2019

(65) Prior Publication Data
US 2020/0126622 A1 Apr. 23, 2020

(30) Foreign Application Priority Data
Oct. 19, 2018 (JP) .................. 2018-197545

(51) Int. Cl.
*G11C 16/04* (2006.01)
*G11C 11/56* (2006.01)
*G11C 16/08* (2006.01)
G11C 16/24 (2006.01)
G11C 11/408 (2006.01)
G11C 11/40 (2006.01)
G11C 5/06 (2006.01)

(52) U.S. Cl.
CPC ...... *G11C 16/0483* (2013.01); *G11C 11/5628* (2013.01); *G11C 16/08* (2013.01); G11C 5/06 (2013.01); G11C 11/40 (2013.01); G11C 11/4085 (2013.01); G11C 16/24 (2013.01)

(58) Field of Classification Search
None
See application file for complete search history.

(56) References Cited

U.S. PATENT DOCUMENTS

| | | | |
|---|---|---|---|
| 6,839,283 B1 | 1/2005 | Futatsuyama et al. |
| 7,859,901 B2 | 12/2010 | Iwai et al. |
| 7,876,618 B2 | 1/2011 | Lee et al. |
| 8,400,812 B2 | 3/2013 | Kutsukake et al. |
| 8,431,969 B2 | 4/2013 | Kim et al. |
| 10,276,585 B2 | 4/2019 | Utsumi |

(Continued)

FOREIGN PATENT DOCUMENTS

| | | |
|---|---|---|
| JP | 2005-039016 A | 2/2005 |
| JP | 2009-141278 A | 6/2009 |

(Continued)

*Primary Examiner* — Tan T. Nguyen
(74) *Attorney, Agent, or Firm* — Oblon, McClelland, Maier & Neustadt, L.L.P.

(57) ABSTRACT

A semiconductor device includes: a semiconductor substrate; a plurality of transistors provided on a surface of the semiconductor substrate; and a first circuit electrically connected to gate electrodes of the plurality of transistors. The plurality of transistors include: a first transistor and a second transistor that are adjacent via an insulating region in a first direction; a third transistor that is adjacent to the first transistor and the second transistor via the insulating region in a second direction intersecting the first direction; and a fourth transistor that is adjacent to the first transistor and the second transistor via the insulating region in the second direction. The first circuit sets the first through fourth transistors to an ON state according to a first signal.

17 Claims, 29 Drawing Sheets

(56) References Cited

U.S. PATENT DOCUMENTS

| | | | |
|---|---|---|---|
| 2015/0049535 A1* | 2/2015 | Yamauchi | G11C 5/02 |
| | | | 365/51 |
| 2016/0268304 A1 | 9/2016 | Ikeda et al. | |
| 2018/0047744 A1 | 2/2018 | Utsumi | |
| 2018/0233185 A1 | 8/2018 | Futatsuyama | |
| 2018/0247950 A1* | 8/2018 | Yun | H01L 27/11582 |

FOREIGN PATENT DOCUMENTS

| | | |
|---|---|---|
| JP | 2016-171243 A | 9/2016 |
| JP | WO 2017/122302 A1 | 7/2017 |
| JP | 2018-026518 A | 2/2018 |
| TW | 201743335 A | 12/2017 |

\* cited by examiner

SEMICONDUCTOR DEVICE AND SEMICONDUCTOR MEMORY DEVICE

CROSS-REFERENCE TO RELATED APPLICATIONS

This application is based upon and claims the benefit of Japanese Patent Application No. 2018-197545, filed on Oct. 19, 2018, the entire contents of which are incorporated herein by reference.

BACKGROUND

Field

Embodiments relate to a semiconductor device and a semiconductor memory device.

Description of the Related Art

There is known a semiconductor memory device that includes: a substrate; a plurality of conductive layers aligned in a first direction intersecting a surface of the substrate; a semiconductor column extending in the first direction and facing the plurality of conductive layers; and an insulating film provided between the plurality of conductive layers and the semiconductor column.

DETAILED DESCRIPTION

Figure 1:
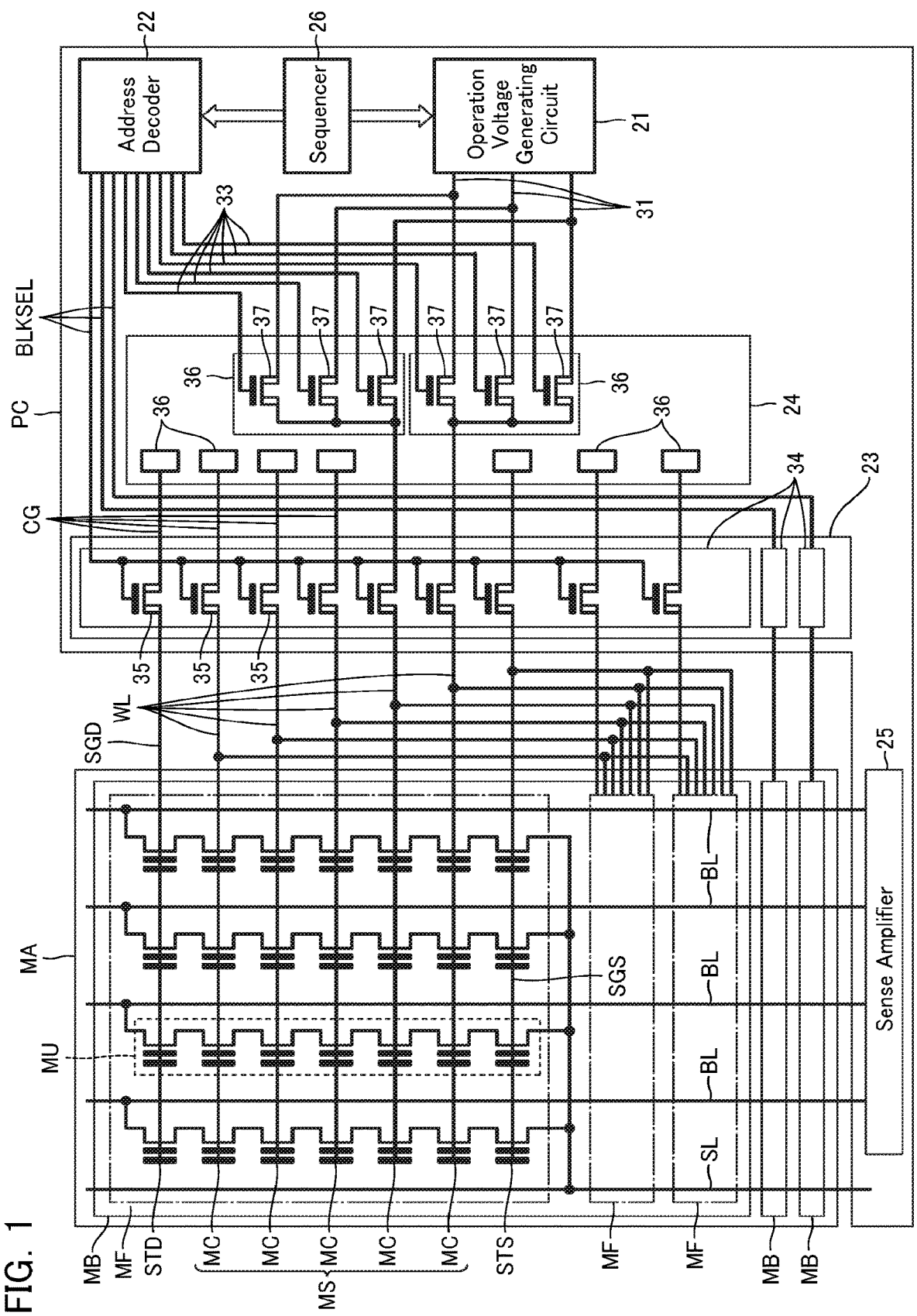
FIG. 1 is an equivalent circuit diagram showing a schematic configuration of a semiconductor memory device according to a first embodiment.

A semiconductor device according to an embodiment includes: a semiconductor substrate; a plurality of transistors provided on a surface of the semiconductor substrate; and a first circuit electrically connected to gate electrodes of the plurality of transistors. The plurality of transistors include: a first transistor and a second transistor that are adjacent via an insulating region in a first direction; a third transistor that is adjacent to the first transistor and the second transistor via the insulating region in a second direction intersecting the first direction; and a fourth transistor that is adjacent to the first transistor and the second transistor via the insulating region in the second direction. The first circuit sets the first through fourth transistors to an ON state according to a first signal.

A semiconductor memory device according to an embodiment includes: a semiconductor substrate; first through fourth conductive layers aligned in a first direction intersecting a surface of the semiconductor substrate; a first semiconductor column extending in the first direction and facing the first through fourth conductive layers; a first insulating film provided between the first through fourth conductive layers and the first semiconductor column; and a plurality of transistors provided on the surface of the semiconductor substrate. The plurality of transistors include: a first transistor that is electrically connected to the first conductive layer; a second transistor that is electrically connected to the second conductive layer and is adjacent to the first transistor via an insulating region in a second direction intersecting the first direction; a third transistor that is electrically connected to the third conductive layer and is adjacent to the first transistor and the second transistor via the insulating region in a third direction intersecting the first direction and the second direction; and a fourth transistor that is electrically connected to the fourth conductive layer and is adjacent to the first transistor and the second transistor via the insulating region in the third direction.

A semiconductor memory device according to an embodiment includes: a semiconductor substrate; a first memory block and a second memory block that are provided separated from the semiconductor substrate in a first direction intersecting a surface of the semiconductor substrate, and are aligned in a second direction intersecting the first direction;

and a plurality of transistors that are provided on the surface of the semiconductor substrate, and are aligned in a third direction intersecting the first direction and the second direction. The first memory block includes: a plurality of first conductive layers aligned in the first direction; a first semiconductor column extending in the first direction and facing the plurality of first conductive layers; and a first insulating film provided between the plurality of first conductive layers and the first semiconductor column. The second memory block includes: a plurality of second conductive layers aligned in the first direction; a second semiconductor column extending in the first direction and facing the plurality of second conductive layers; and a second insulating film provided between the plurality of second conductive layers and the second semiconductor column. The plurality of transistors include: a first transistor that is electrically connected to one of the plurality of first conductive layers; a second transistor that is electrically connected to one of the plurality of second conductive layers; a third transistor that is electrically connected to one of the plurality of first conductive layers and is provided between the first transistor and the second transistor; and a fourth transistor that is electrically connected to one of the plurality of second conductive layers and is provided between the first transistor and the third transistor.

Next, a semiconductor device and a semiconductor memory device according to embodiments will be described in detail with reference to the drawings. Note that the embodiments below are merely examples, and are not shown with the intention of limiting the present invention.

Moreover, in the present specification, a certain direction parallel to a surface of a semiconductor substrate will be called an X direction, a direction parallel to the surface of the semiconductor substrate and perpendicular to the X direction will be called a Y direction, and a direction perpendicular to the surface of the semiconductor substrate will be called a Z direction.

Moreover, in the present specification, sometimes, a direction along a certain plane will be called a first direction, a direction intersecting the first direction along this certain plane will be called a second direction, and a direction intersecting this certain plane will be called a third direction. These first direction, second direction, and third direction may, but need not, each respectively correspond to any one of the X direction, the Y direction, and the Z direction.

Moreover, in the present specification, expressions such as "up" or "down" will be defined with reference to the semiconductor substrate. For example, in the case where the above-described first direction intersects the surface of the semiconductor substrate, an orientation of moving away from the semiconductor substrate along this first direction will be called up, and an orientation of coming closer to the semiconductor substrate along the first direction will be called down. Moreover, when a lower surface or a lower end section is referred to for a certain configuration, this will be assumed to mean a surface or end section on a semiconductor substrate side of this configuration, and when an upper surface or an upper end section is referred to for a certain configuration, this will be assumed to mean a surface or end section on an opposite side to the semiconductor substrate of this configuration. Moreover, a surface intersecting the second direction or the third direction will be called a side surface, and so on.

Moreover, in the present specification, when a first configuration is said to be "electrically connected" to a second configuration, the first configuration may be connected to the second configuration directly, or the first configuration may be connected to the second configuration via the likes of a wiring, a semiconductor member, or a transistor. For example, even when, in the case of three transistors having been directly connected, the second transistor is in an OFF state, the first transistor is "electrically connected" to the third transistor.

Moreover, in the present specification, when a first configuration is said to be "electrically insulated" from a second configuration, this will be assumed to mean a state where, for example, an insulating film, or the like, is provided between the first configuration and the second configuration, and there is not provided the likes of a contact or wiring connecting the first configuration and the second configuration.

Moreover, in the present specification, when a "field effect type transistor" or a "field effect transistor" is referred to, this will be assumed to mean a transistor that includes: a semiconductor layer functioning as a channel region; a gate insulating film; and a gate electrode.

First Embodiment

Overall Configuration

A configuration of a semiconductor memory device according to a first embodiment will be described below with reference to the drawings. Note that the drawings below are schematic, and for convenience of description, sometimes omit part of the configuration.

FIG. 1 is schematic equivalent circuit diagram showing the configuration of the semiconductor memory device according to the first embodiment.

The semiconductor memory device according to the present embodiment includes: a memory cell array MA; and a peripheral circuit PC that controls the memory cell array MA.

The memory cell array MA includes a plurality of memory blocks MB. These plurality of memory blocks MB each include a plurality of memory fingers MF. These plurality of memory fingers MF each include a plurality of memory units MU. One ends of these plurality of memory units MU are respectively connected to the peripheral circuit PC via bit lines BL. Moreover, the other ends of these plurality of memory units MU are each connected to the peripheral circuit PC via a common source line SL.

The memory unit MU includes a drain select transistor STD, a memory string MS, and a source select transistor STS that are connected in series between the bit line BL and the source line SL. Hereafter, the drain select transistor STD and the source select transistor STS will sometimes simply be called select transistors (STD, STS).

The memory string MS includes a plurality of memory cells MC connected in series. The memory cell MC according to the present embodiment is a field effect type transistor that includes a charge accumulating film in its gate insulating film. A threshold voltage of the memory cell MC changes according to an amount of charge in the charge accumulating film. Note that gate electrodes of the plurality of memory cells MC corresponding to one memory string MS are respectively connected to word lines WL. These word lines WL are respectively commonly connected to all of the memory units MU in one memory block MB.

The select transistor (STD, STS) is a field effect type transistor. Select gate lines (SGD, SGS) are respectively connected to gate electrodes of the select transistors (STD, STS). A drain select line SGD is provided correspondingly to the memory finger MF and is commonly connected to all of the memory units MU in one memory finger MF. A source select line SGS is commonly connected to all of the memory units MU in one memory block MB.

The peripheral circuit PC includes: an operation voltage generating circuit 21 that generates operation voltages; an address decoder 22 that decodes address data; a block select circuit 23 and a voltage select circuit 24 that transfer the operation voltages to the memory cell array MA according to an output signal of the address decoder 22; a sense amplifier 25 connected to the bit lines BL; and a sequencer 26 that controls them.

The operation voltage generating circuit 21 includes a plurality of operation voltage output terminals 31. The operation voltage generating circuit 21 includes, for example, a step-down circuit such as a regulator and a step-up circuit such as a charge pump circuit. The operation voltage generating circuit 21 for example generates a plurality of operation voltages to be applied to the bit lines BL, the source line SL, the word lines WL, and the select gate lines (SGD, SGS) during a read operation, a write operation, and an erase operation on the memory cell array MA, and outputs the generated operation voltages simultaneously to the plurality of operation voltage output terminals 31, according to a control signal from the sequencer 26. The operation voltage outputted from the operation voltage output terminal 31 is appropriately adjusted according to the control signal from the sequencer 26.

The operation voltage generating circuit 21 generates a read voltage and a read pass voltage as the operation voltages, during the read operation. The read voltage is a voltage used to read data stored in a selected memory cell MC. When the read voltage is applied to the word line WL, some of the plurality of memory cells MC connected to this word line WL attain an ON state, and the other memory cells MC attain an OFF state. The read pass voltage is a voltage for setting the memory cell MC to an ON state, and is larger than the read voltage. When the read pass voltage is applied to the word line WL, the plurality of memory cells MC connected to this word line WL all attain an ON state.

Moreover, the operation voltage generating circuit 21 generates a write pass voltage and a program voltage as the operation voltages, during the write operation. The write pass voltage is a voltage for setting the memory cell MC to an ON state, and has a magnitude of the read voltage or more. When the write pass voltage is applied to the word line WL, the plurality of memory cells MC connected to this word line WL all attain an ON state. The program voltage is a voltage for accumulating a charge in the charge accumulating film of the memory cell MC, and is larger than the write pass voltage. When the program voltage is applied to the word line WL, charge accumulates in the charge accumulating film of some of the plurality of memory cells MC connected to this word line WL.

The address decoder 22 includes a plurality of block select lines BLKSEL and a plurality of voltage select lines 33. The address decoder 22 for example sequentially refers to address data of an address register and decodes this address data to set to an ON state certain block select transistors 35 and voltage select transistors 37 corresponding to the address data and set to an OFF state the other block select transistors 35 and voltage select transistors 37, according to a control signal from the sequencer 26. For example, the address decoder 22 sets voltages of certain block select lines BLKSEL and voltage select lines 33 to an "H" state, and sets voltages of the other block select lines BLKSEL and voltage select lines 33 to an "L" state. Note that when transistors of P channel type, not N channel type, are employed, these wirings are applied with reverse voltages.

Note that in the address decoder 22 in the illustrated example, the block select lines BLKSEL are provided one at a time for each individual memory block MB. However, this configuration can be appropriately changed. For example, the block select lines BLKSEL may be provided one at a time for every two or more of the memory blocks MB.

The block select circuit 23 includes a plurality of block selectors 34 corresponding to the memory blocks MB. These plurality of block selectors 34 each include a plurality of the block select transistors 35 corresponding to the word lines WL and the select gate lines (SGD, SGS). The block select transistor 35 is a field effect type high voltage-withstanding transistor, for example. Drain electrodes of the block select transistors 35 are respectively electrically connected to corresponding word lines WL or select gate lines (SGD, SGS). Source electrodes of the block select transistors 35 are respectively electrically connected to the operation voltage output terminals 31 via wirings CG and the voltage select circuit 24. Gate electrodes of the block select transistors 35 are commonly connected to a corresponding block select line BLKSEL.

Note that in the block select circuit 23 in the illustrated example, the block select transistors 35 are provided one at a time for each individual word line WL, and the block select transistors 35 are provided one at a time for each individual select gate line (SGD, SGS). However, this configuration can be appropriately changed. For example, the block select transistors 35 may be provided two at a time for each individual select gate line (SGD, SGS).

The voltage select circuit 24 includes a plurality of voltage selectors 36 corresponding to the word lines WL and the select gate lines (SGD, SGS). These plurality of voltage selectors 36 each include a plurality of the voltage select transistors 37. The voltage select transistor 37 is a field effect type high voltage-withstanding transistor, for example. Drain terminals of the voltage select transistors 37 are respectively electrically connected to corresponding word lines WL or select gate lines (SGD, SGS), via wirings CG and the block select circuit 23. Source terminals of the voltage select transistors 37 are respectively electrically connected to corresponding operation voltage output terminals 31. Gate electrodes of the voltage select transistors 37 are respectively connected to corresponding voltage select lines 33.

The sense amplifier 25 is connected to a plurality of the bit lines BL. The sense amplifier 25 includes a plurality of sense amplifier units corresponding to the bit lines BL, for example. The sense amplifier units each include: a clamp transistor that charges the bit line BL based on a voltage generated in the operation voltage generating circuit 21; a sense circuit that senses a voltage or current of the bit line BL; a plurality of latches that hold an output signal of this sense circuit, or write data, a verify pass flag, and so on; and a plurality of wirings connected to these latches. The plurality of latches and the plurality of wirings function as a logic circuit. During the read operation, for example, the logic circuit specifies data held in the memory cell MC by referring to data held in the latches. Moreover, during the write operation, for example, the logic circuit controls the voltage of the bit line BL by referring to data of a lower-order page, a middle-order page and an upper-order page held in the latches.

The sequencer 26 outputs a control signal to the operation voltage generating circuit 21, the address decoder 22, and the sense amplifier 25, according to an inputted command and a state of the semiconductor memory device. For example, the sequencer 26 sequentially refers to command data of a command register in accordance with a clock signal, and decodes this command data to be outputted to the operation voltage generating circuit 21, the address decoder 22, and the sense amplifier 25.

Figure 2:
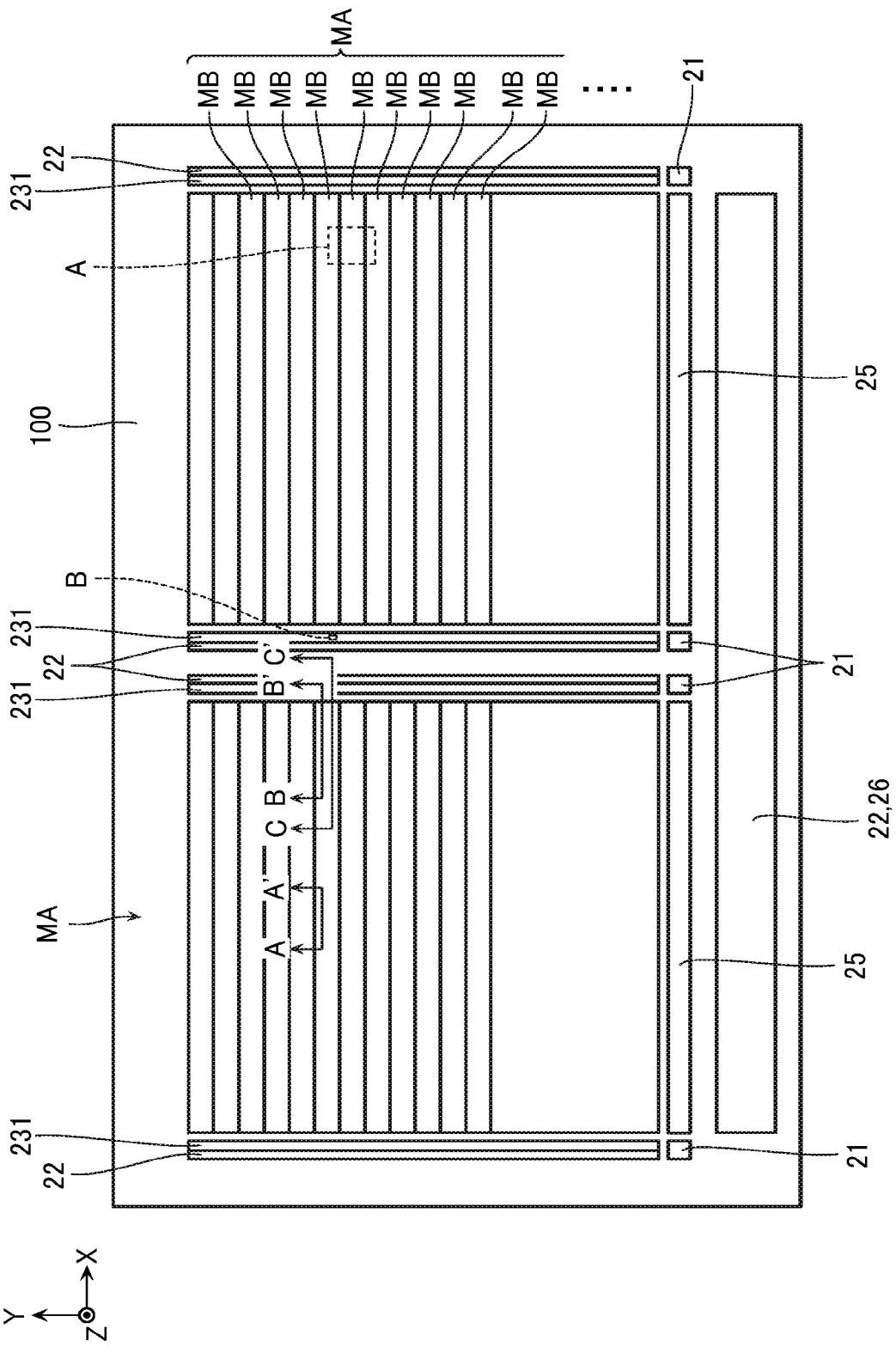
FIG. 2 is a schematic plan view of same semiconductor memory device.

Next, the configuration of the semiconductor memory device according to the present embodiment will be described with reference to FIG. 2. FIG. 2 is a schematic plan view of the semiconductor memory device according to the present embodiment. Note that FIG. 2 shows a schematic configuration, and that a specific configuration may be appropriately changed. Moreover, in FIG. 2, part of the configuration is omitted.

As shown in FIG. 2, the semiconductor memory device according to the present embodiment includes a semiconductor substrate 100. In the illustrated example, the semiconductor substrate 100 is provided with two memory cell arrays MA aligned in the X direction. Moreover, in each of regions extending in the Y direction along both end sections in the X direction of the memory cell array MA, there are provided, in order of closeness to the memory cell array MA, a block select circuit section 231 and the address decoder 22. Moreover, in a region extending in the X direction along an end section in the Y direction of the memory cell array MA, there is provided the sense amplifier 25. Regions in vicinities of both end sections in the X direction of the region where the sense amplifier 25 has been provided, are each provided with the operation voltage generating circuit 21. Moreover, a region on an outer side of these regions is provided with the sequencer 26.

Memory Cell Array MA

Figure 3:
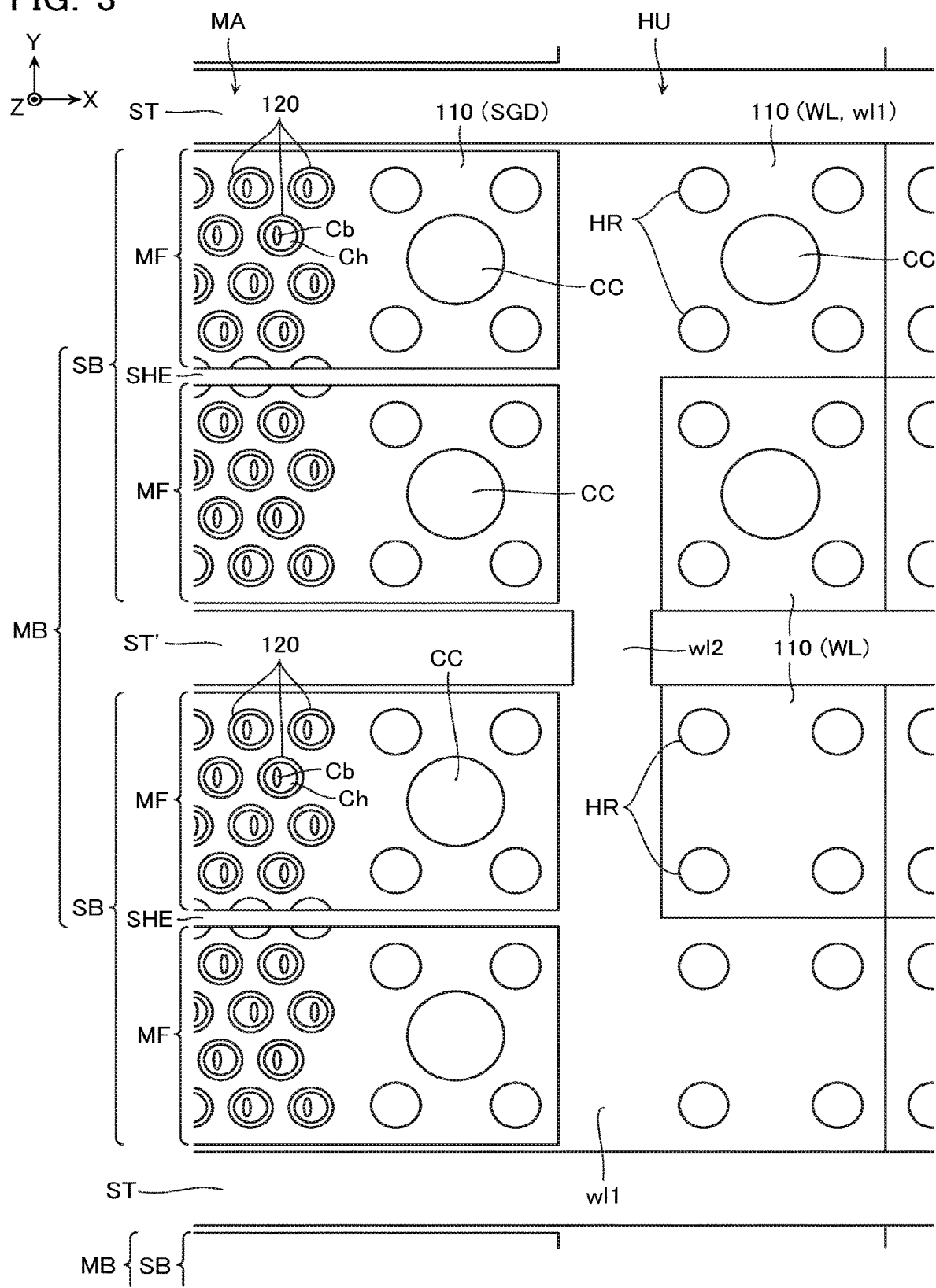
FIG. 3 is a schematic enlarged view of the portion indicated by A in FIG. 2.
Figure 4:
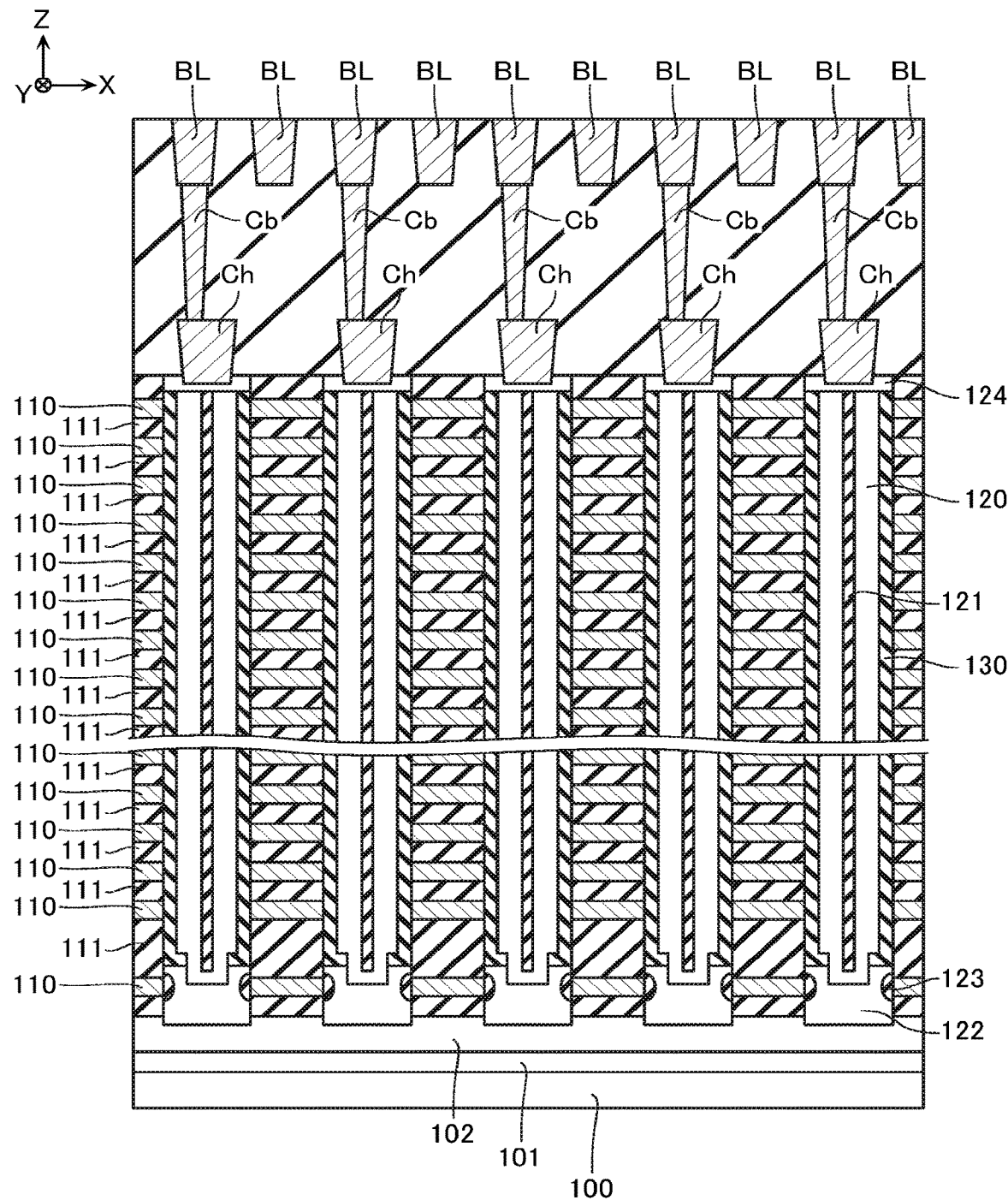
FIG. 4 is a schematic cross-sectional view of the case where the structure shown in FIG. 2 is cut along the line A-A' and seen from a direction of the arrows.
Figure 5:
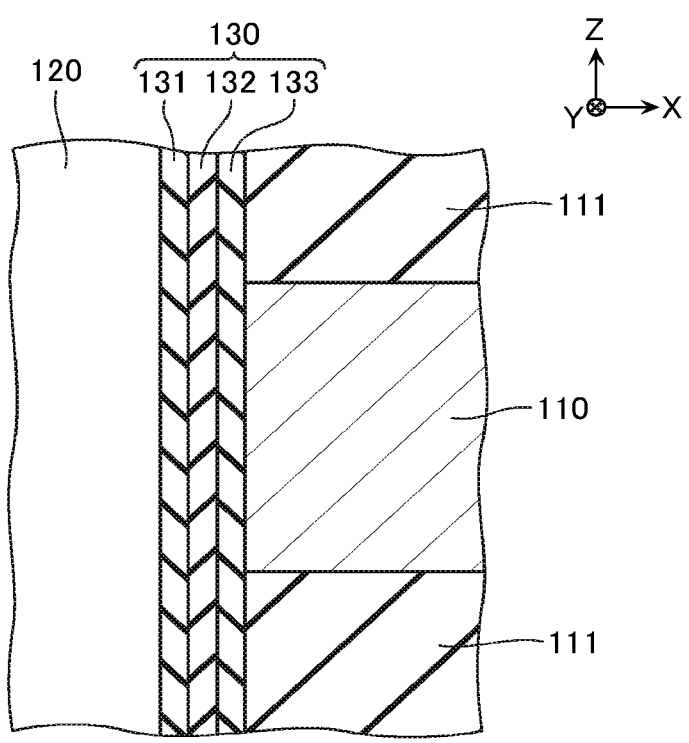
FIG. 5 is a schematic enlarged view of part of FIG. 4.
Figure 6:
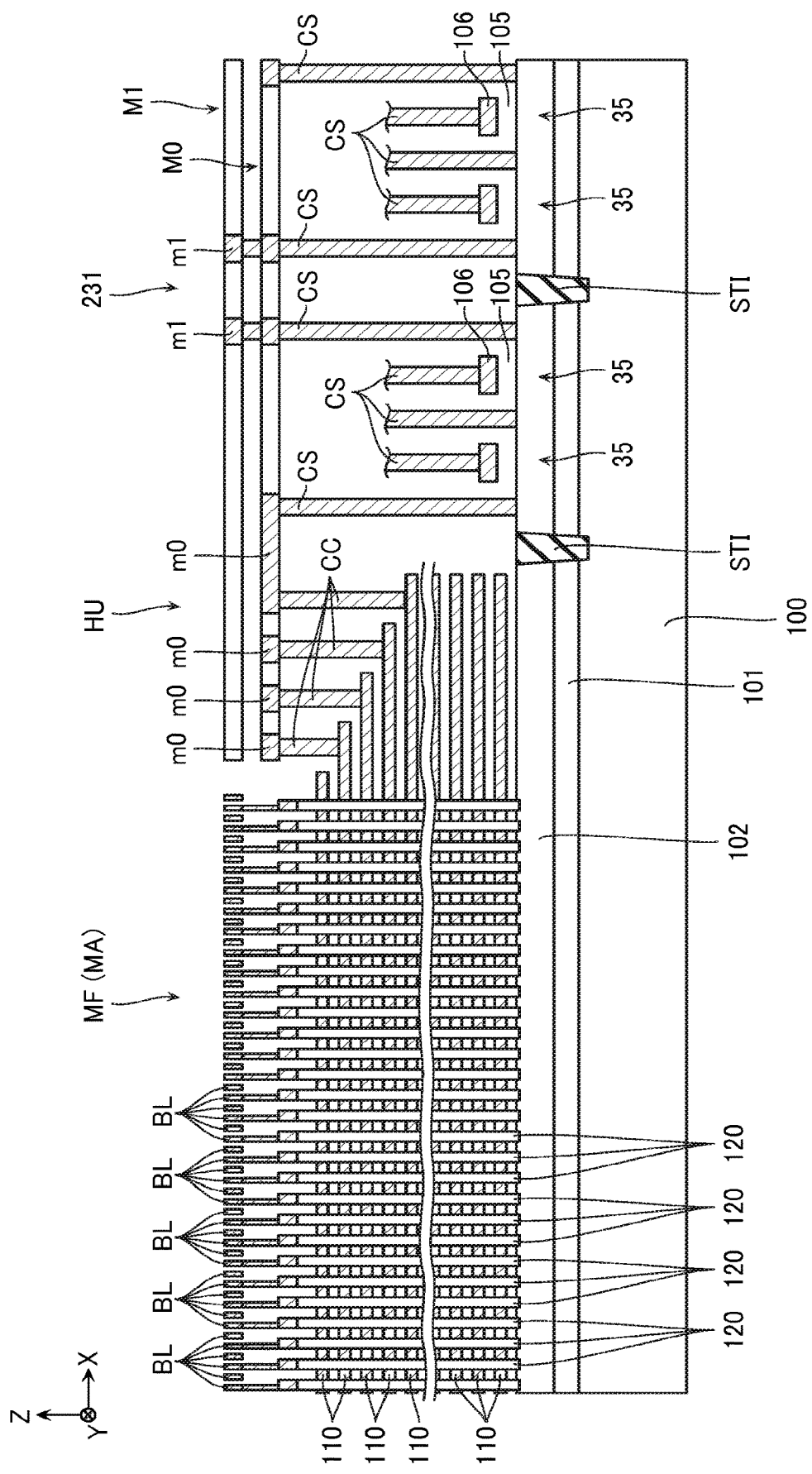
FIG. 6 is a schematic cross-sectional view of the case where the structure shown in FIG. 2 is cut along the line B-B' and seen from a direction of the arrows.
Figure 7:
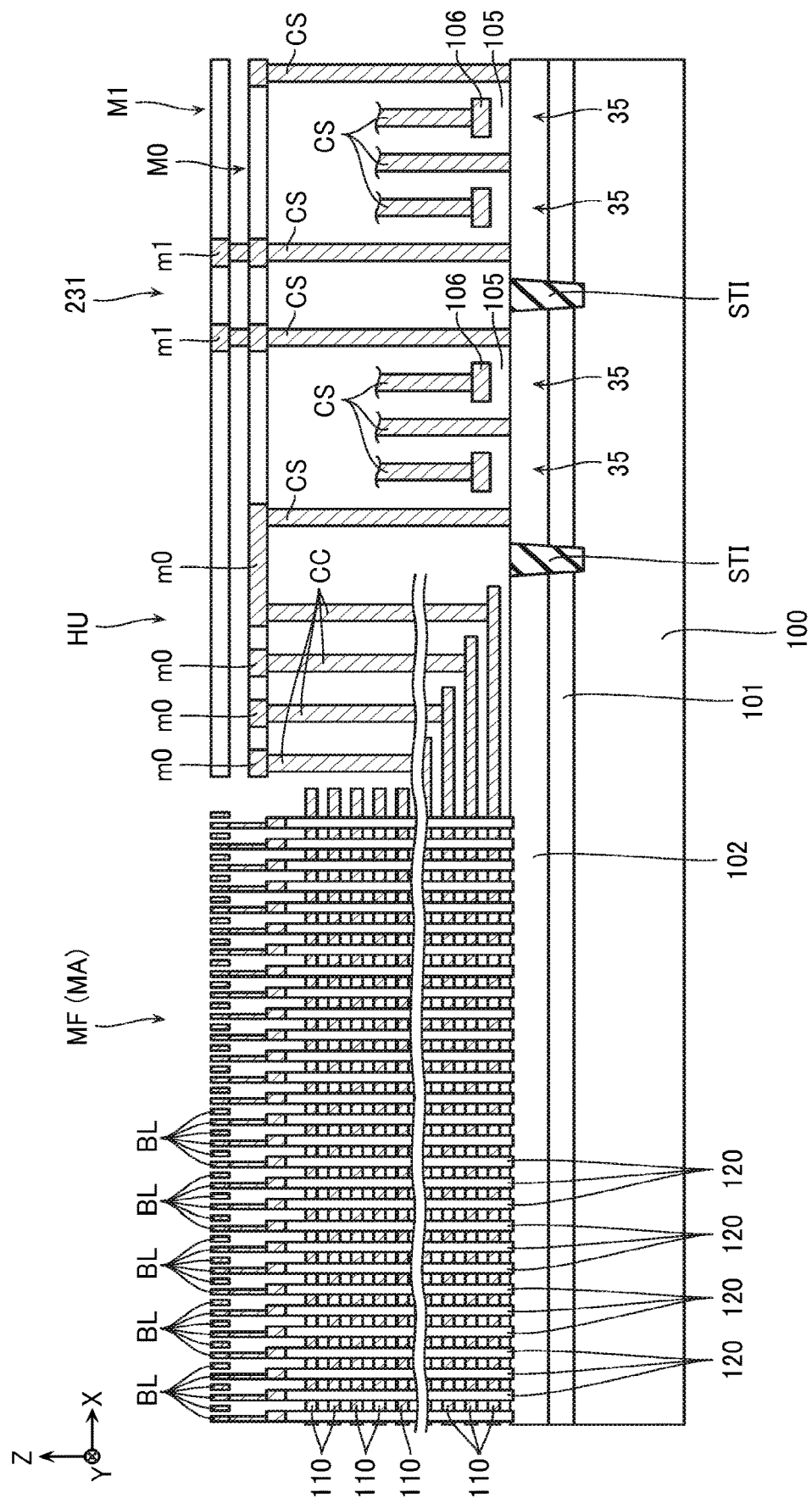
FIG. 7 is a schematic cross-sectional view of the case where the structure shown in FIG. 2 is cut along the line C-C' and seen from a direction of the arrows.

Next, a configuration of the memory cell array MA will be described with reference to FIGS. 2-7. FIG. 3 is a schematic enlarged view of the portion indicated by A in FIG. 2. FIG. 4 is a schematic cross-sectional view of the case where the structure shown in FIG. 2 is cut along the line A-A' and seen from a direction of the arrows. FIG. 5 is a schematic enlarged view of part of FIG. 4. FIG. 6 is a schematic cross-sectional view of the case where the structure shown in FIG. 2 is cut along the line B-B' and seen from a direction of the arrows. FIG. 7 is a schematic cross-sectional view of the case where the structure shown in FIG. 2 is cut along the line C-C' and seen from a direction of the arrows. Note that FIGS. 3-7 show a schematic configuration, and that a specific configuration may be appropriately changed. Moreover, in FIGS. 3-7, part of the configuration is omitted.

As shown in FIG. 2, the memory cell array MA includes a plurality of the memory blocks MB aligned in the Y direction. As shown in FIG. 3, an inter-block insulating layer ST extending in the X direction is provided between two memory blocks MB adjacent in the Y direction. The word lines WL included in these two memory blocks MB are electrically insulated via the inter-block insulating layer ST.

The memory block MB includes: two sub-blocks SB aligned in the Y direction; an inter-sub-block insulating layer ST' provided between these two sub-blocks SB; and a hookup HU connected to these two sub-blocks SB.

The sub-block SB includes: two of the memory fingers MF aligned in the Y direction; and an inter-finger insulating layer SHE provided between these two memory fingers MF. As shown in FIG. 4, the memory finger MF includes the following, provided on the semiconductor substrate 100, namely: a plurality of conductive layers 110; a plurality of semiconductor columns 120; and a plurality of gate insulating films 130 respectively provided between the plurality of conductive layers 110 and the plurality of semiconductor columns 120.

The semiconductor substrate 100 is a semiconductor substrate of the likes of single crystal silicon (Si) including a P type impurity, for example. Part of a surface of the semiconductor substrate 100 is provided with an N type well 101 including an N type impurity such as phosphorus (P). Moreover, part of a surface of the N type well 101 is provided with a P type well 102 including a P type impurity such as boron (B). Moreover, part of the surface of the semiconductor substrate 100 is provided with an insulating region STI of $SiO_2$ or the like (FIGS. 6 and 7). Hereafter, a region not provided with the insulating region STI, of the surface of the semiconductor substrate 100 will sometimes be called a semiconductor region.

A plurality of the conductive layers 110, each being a substantially plate-like conductive layer extending in the X direction, are aligned in the Z direction. The conductive layer 110 may include the likes of a laminated film of titanium nitride (TiN) and tungsten (W), or may include the likes of polycrystalline silicon including an impurity such as phosphorus or boron, for example. Moreover, an insulating layer 111 (FIG. 4) of the likes of silicon oxide ($SiO_2$) is provided between the conductive layers 110.

The one or plurality of conductive layers 110 positioned in a lowermost layer, of the plurality of conductive layers 110 function as the source select line SGS (FIG. 1) and as the gate electrodes of the plurality of source select transistors STS connected to this source select line SGS. Moreover, the plurality of conductive layers 110 positioned more upwardly than these lowermost-layer-positioned conductive layers 110, of the plurality of conductive layers 110 function as the word lines WL (FIG. 1) and as the gate electrodes of the plurality of memory cells MC (FIG. 1) connected to these word lines WL. Moreover, the one or plurality of conductive layers 110 positioned more upwardly than these more-upwardly-positioned conductive layers 110, of the plurality of conductive layers 110 function as the drain select line SGD and as the gate electrodes of the plurality of drain select transistors STD (FIG. 1) connected to this drain select line SGD. Note that in the example of FIG. 3, the conductive layers 110 functioning as the word lines WL and the source select line SGS each include: two first portions wl1 provided correspondingly to the sub-blocks SB and extending in the X direction; and a second portion wl2 connected to these two first portions wl1. Moreover, a plurality of the conductive layers 110 functioning as the drain select line SGD, and so on, each having narrower widths in the Y direction than the first portions wl1 of the other conductive layers 110 do, are aligned in the Y direction correspondingly to the memory fingers MF.

A plurality of the semiconductor columns 120 are arranged in the X direction and the Y direction. The semiconductor column 120 is a semiconductor film of the likes of non-doped polycrystalline silicon (Si), for example. As shown in FIG. 4, the semiconductor column 120 has a substantially cylindrical shape, and has its central portion provided with an insulating film 121 of the likes of silicon oxide, for example. Moreover, outer circumferential surfaces of the semiconductor columns 120 are each surrounded by the conductive layers 110. A lower end section of the semiconductor column 120 is connected to the P type well 102 of the semiconductor substrate 100 via a semiconductor layer 122 of the likes of non-doped single crystal silicon. The semiconductor layer 122 faces the conductive layer 110 via an insulating layer 123 of the likes of silicon oxide. An upper end section of the semiconductor column 120 is connected to the bit line BL via a semiconductor layer 124 including an N type impurity such as phosphorus (P) and via contacts Ch and Cb. The semiconductor columns 120 each function as channel regions of the plurality of memory cells MC and the drain select transistor STD included in one memory unit MU (FIG. 1). The semiconductor layer 122 functions as a channel region of the source select transistor STS.

As shown in FIG. 5, for example, the gate insulating film 130 includes a tunnel insulating film 131, a charge accumulating film 132, and a block insulating film 133 that are laminated between the semiconductor column 120 and the conductive layer 110. The tunnel insulating film 131 and the block insulating film 133 are insulating films of the likes of silicon oxide, for example. The charge accumulating film 132 is a film capable of accumulating a charge, of the likes of silicon nitride (SiN), for example.

Note that although FIG. 5 shows an example where the gate insulating film 130 includes the charge accumulating film 132 of the likes of silicon nitride, the gate insulating film 130 may include a floating gate of the likes of polycrystalline silicon including an N type or P type impurity, for example.

The hookup HU (FIG. 3) includes: end sections in the X direction of the plurality of conductive layers 110; contacts CC connected to these end sections; dummy structures HR provided in peripheries of the contacts CC; and wiring layers M0, M1 (FIG. 6) provided above these end sections, contacts CC, and so on. As exemplified in FIG. 3, the end sections in the X direction of the plurality of conductive layers 110 are aligned in a matrix in the X direction and the Y direction. As exemplified in FIGS. 6 and 7, these end sections are parts of the plurality of conductive layers 110 aligned in the Z direction, and their positions in the Z direction differ from each other. These plurality of conductive layers 110 are connected to drain regions of the block select transistors 35, via the contacts CC extending in the Z direction, a plurality of wirings m0, m1 included in the wiring layers M0, M1, and contacts CS extending in the Z direction.

Block Select Circuit Section 231

Figure 8:
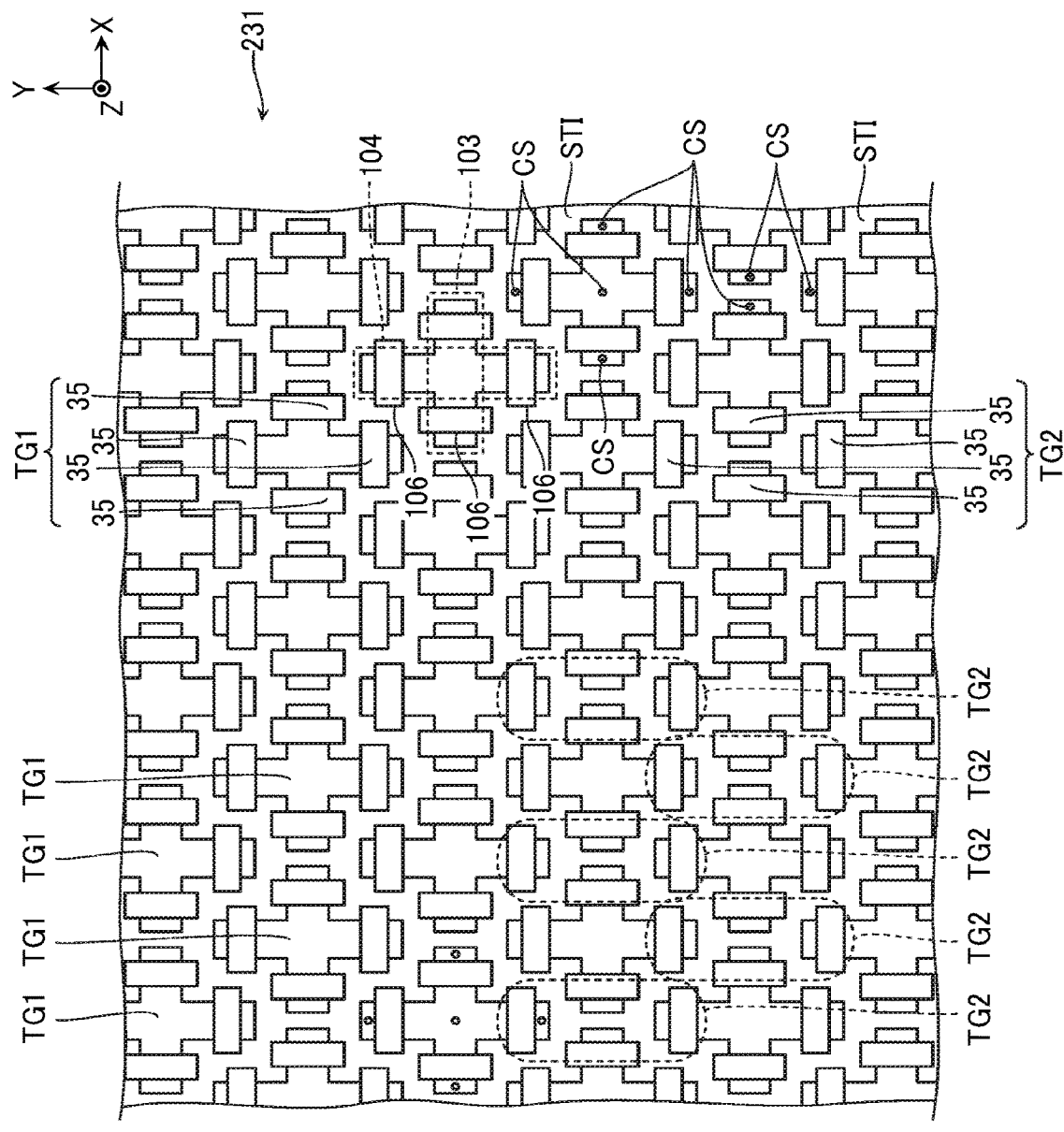
FIG. 8 is a schematic enlarged view of the portion indicated by B in FIG. 2.
Figure 9A:
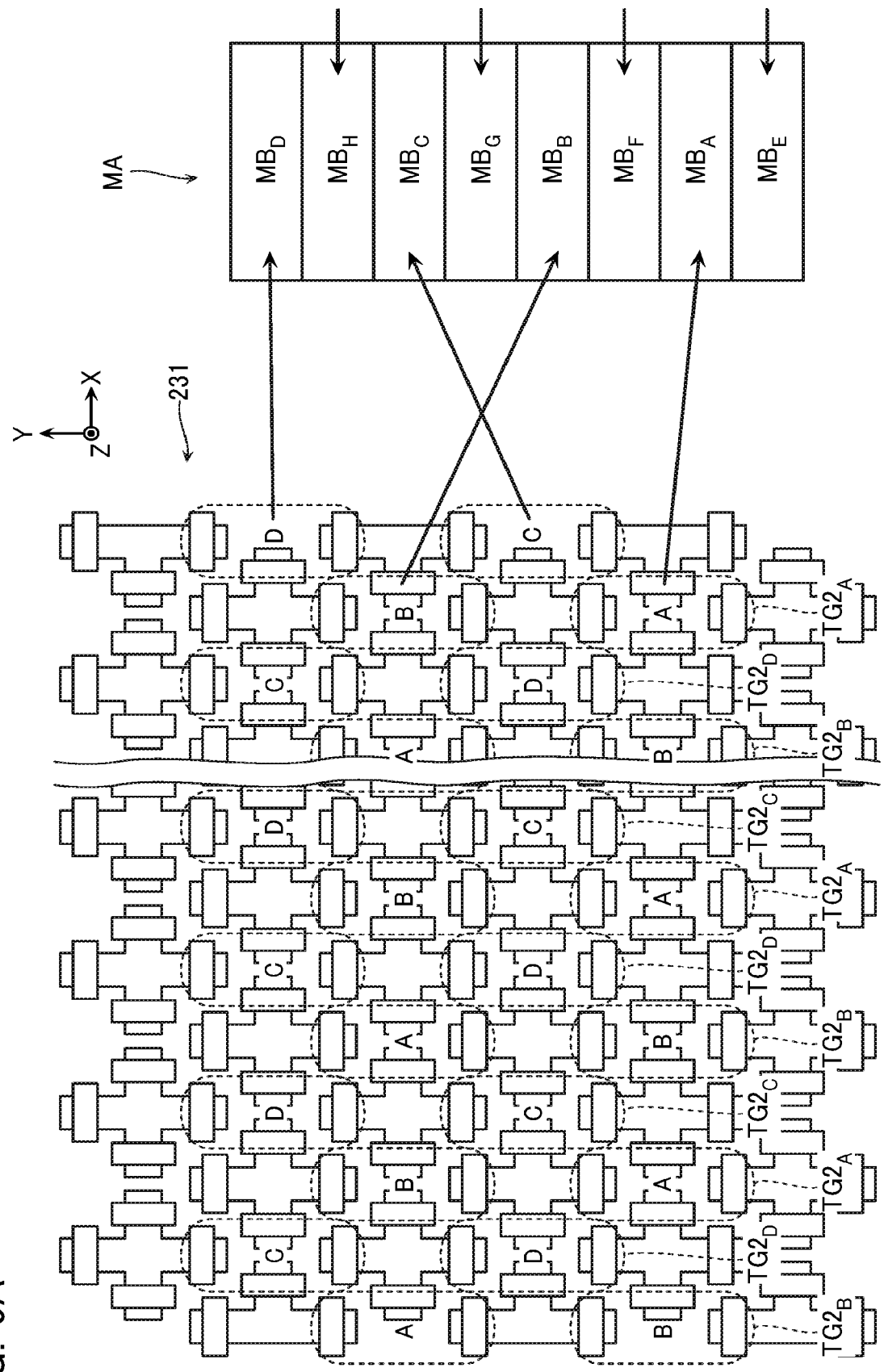
FIG. 9A is an enlarged view of part of FIG. 2
Figure 9B:
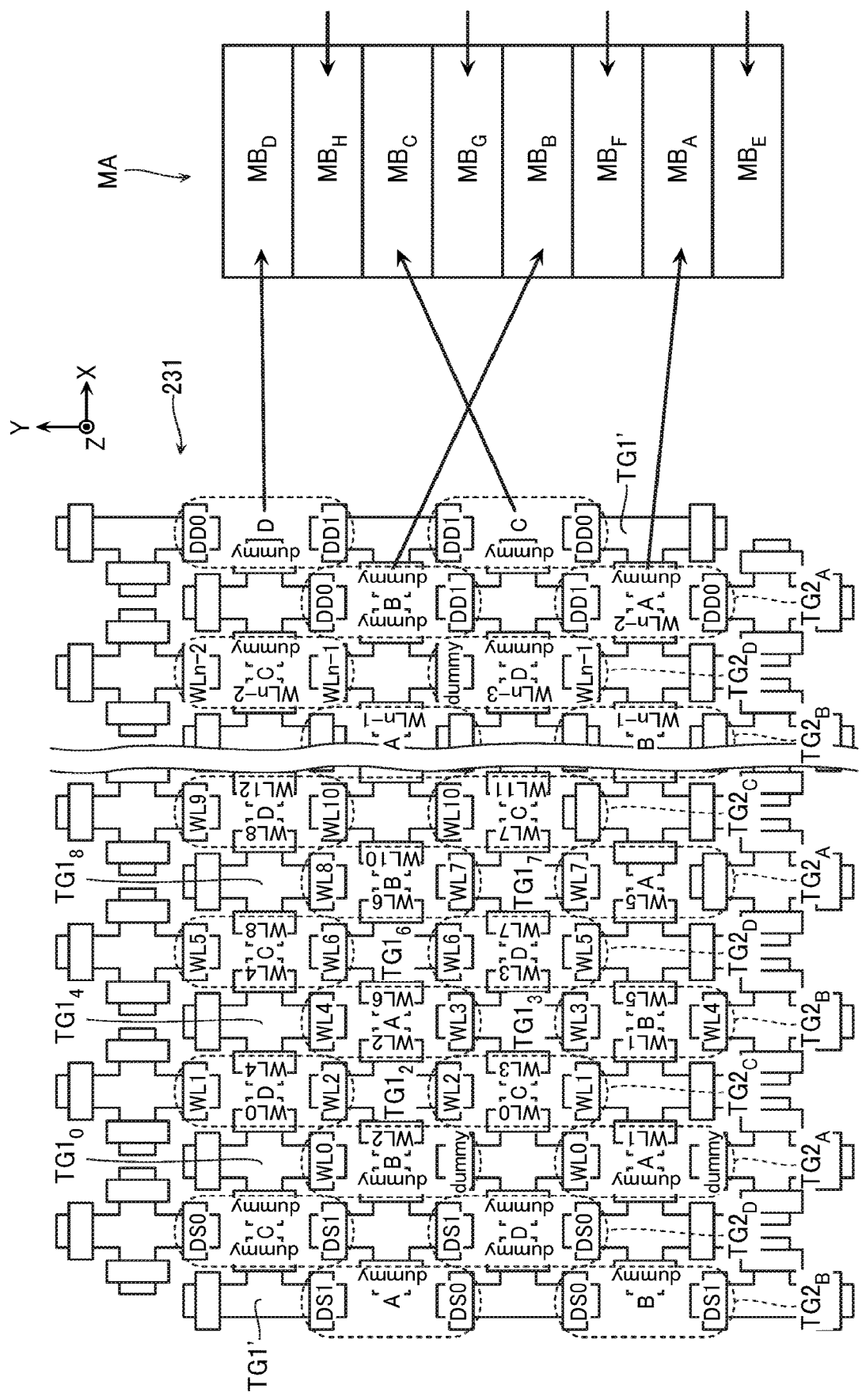
FIG. 9B is an enlarged view of part of FIG. 2.
Figure 10:
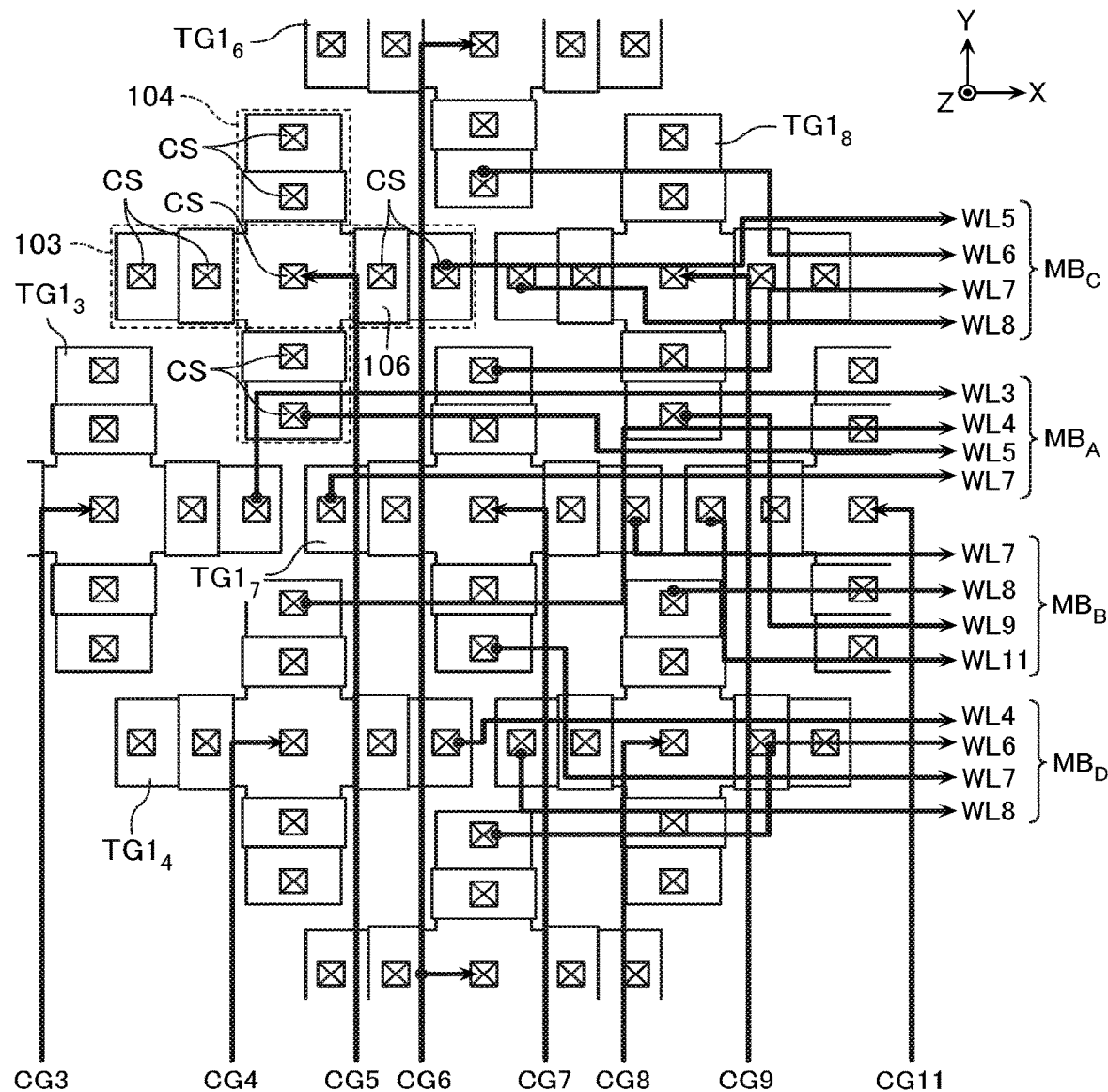
FIG. 10 is an enlarged view of part of FIG. 9A.
Figure 11:
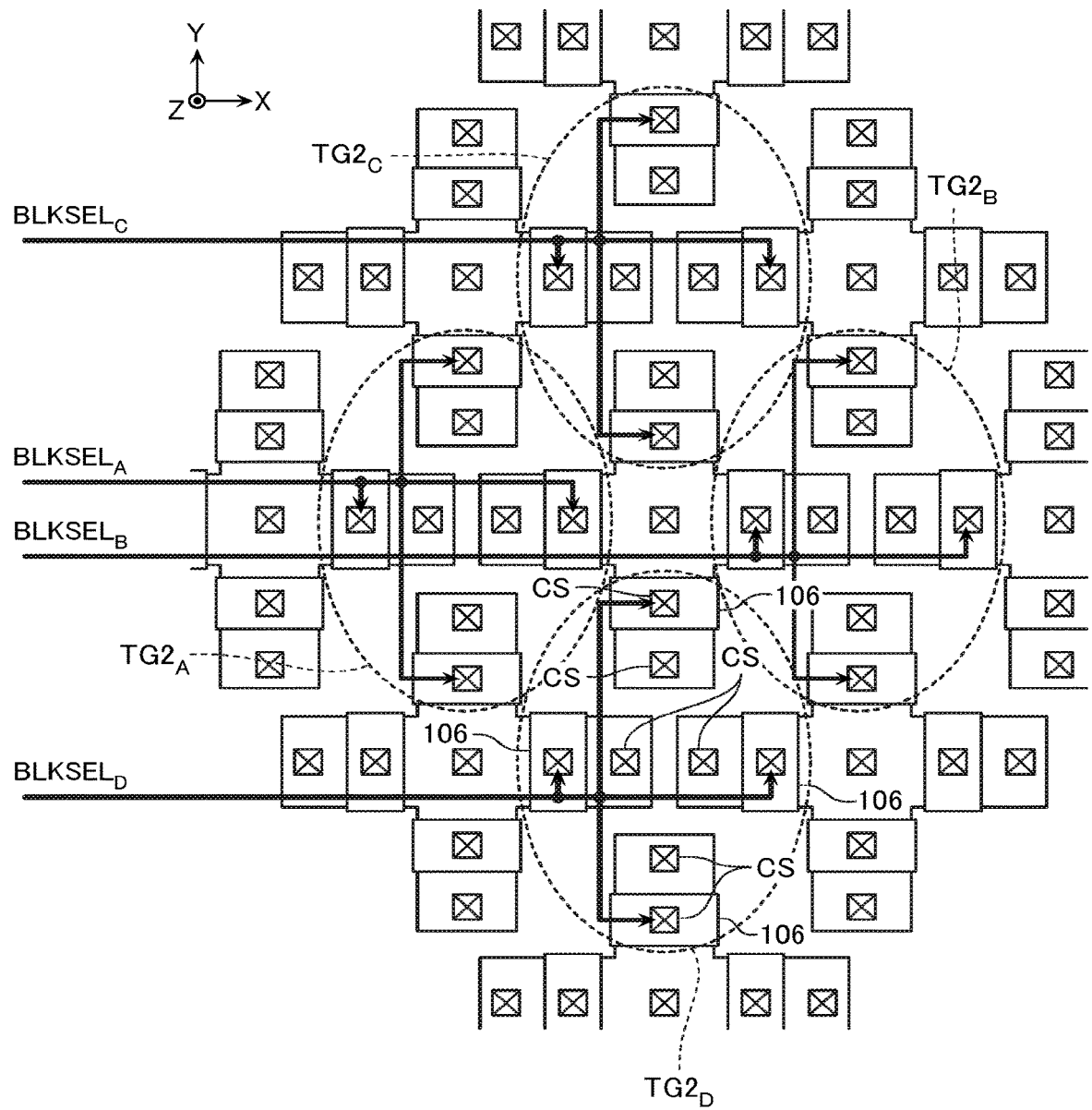
FIG. 11 is an enlarged view of part of FIG. 9A.

Next, a configuration example of the block select circuit section 231 according to the present embodiment will be described with reference to FIGS. 8-11. FIG. 8 is a schematic enlarged view of the portion indicated by B in FIG. 2. FIGS. 9A and 9B are enlarged views of part of FIG. 2. FIGS. 10 and 11 are enlarged views of part of FIG. 9A. However, FIGS. 10 and 11 illustrate some of wirings. Note that wirings CG3-CG9 and CG11 in FIG. 10 are some of the plurality of wirings CG shown in FIG. 1. Moreover, block select lines BLKSEL$_A$-BLKSEL$_D$ in FIG. 11 are some of the plurality of block select lines BLKSEL shown in FIG. 1. Note that FIGS. 8-11 show a schematic configuration, and that a specific configuration may be appropriately changed. Moreover, in FIGS. 8-11, part of the configuration is omitted.

As exemplified in the likes of FIG. 6, in the present embodiment, a plurality of transistors are provided on the surface of the semiconductor substrate 100. Some of these plurality of transistors function as the block select transistor 35 (FIG. 1) configuring the block select circuit section 231, for example.

The block select circuit section 231 is a configuration for achieving the block select circuit 23 of FIG. 1, and, as exemplified in FIG. 8, includes a plurality of the block select transistors 35. The diagram shows four block select transistors 35 having a common source region. Hereafter, such four block select transistors 35 will be called a "transistor group TG1". Moreover, in the illustrated example, drain regions of four block select transistors 35 are adjacent via the insulating region STI. Hereafter, such four block select transistors 35 will be called a "transistor group TG2".

The transistor group TG1 includes: a first semiconductor region 103 extending in the X direction; and a second semiconductor region 104 extending in the Y direction and intersecting the first semiconductor region 103. Moreover, one end section and the other end section in the X direction of the first semiconductor region 103, and one end section and the other end section in the Y direction of the second semiconductor region 104 are each provided with the contact CS functioning as a drain terminal of the block select transistor 35. Moreover, portions where the first semiconductor regions 103 and the second semiconductor regions 104 intersect are each provided with the contact CS functioning as a common source terminal of the four block select transistors 35. Moreover, the contacts CS functioning as the drain terminals and the other contact CS functioning as the source terminal each have provided between them a gate insulating film 105 (FIGS. 6 and 7) and a gate electrode 106.

The transistor group TG2 includes: two block select transistors 35 adjacent in the X direction; and two block select transistors 35 adjacent from one side and the other side in the Y direction to these two block select transistors 35. Note that the four contacts CS connected to the drain regions of these four block select transistors 35 are provided between the gate electrodes 106 of the two block select transistors 35 adjacent in the X direction. Moreover, these four contacts CS are provided between the gate electrodes 106 of the remaining two block select transistors 35.

FIG. 9A shows a relationship of the block select circuit section 231 and the memory blocks MB. FIG. 9A exemplifies eight memory blocks MB$_E$, MB$_A$, MB$_F$, MB$_B$, MB$_G$, MB$_C$, MB$_H$, MB$_D$ provided continuously in the Y direction. As described with reference to FIG. 2, the block select circuit sections 231 are provided one each to one side and the other side in the X direction of the memory cell array MA. The block select circuit section 231 exemplified in FIG. 9A corresponds to the memory blocks MB$_A$, MB$_B$, MB$_C$, MB$_D$. The unillustrated other block select circuit section 231 corresponds to the memory blocks MB$_E$, MB$_F$, MB$_G$, MB$_H$.

The drain regions of the four block select transistors 35 included in the transistor group TG1 are respectively electrically connected to the corresponding word lines WL of the four memory blocks MB, via the contacts CS, and so on. For example, in the example of FIG. 9B, the drain regions of the four block select transistors 35 included in the transistor group TG1$_7$ are respectively electrically connected to the four word lines WL7 included in the memory blocks MB$_A$, MB$_B$, MB$_C$, MB$_D$, via the contacts CS, and so on. The word line WL7 is for example the word line WL which is eighth nearest to the semiconductor substrate 100, of the n (where n is a natural number) word lines WL included in the memory block MB. Moreover, as exemplified in FIG. 10, the source region of these four block select transistors 35 is electrically connected to the wiring CG (for example, the wiring CG7) via the contact CS, and so on. Hereafter, the transistor group TG1 corresponding to the word line WLk which is k+1-th (where k is a natural number not more than n−1) nearest to the semiconductor substrate 100, will sometimes be written as "transistor group TG1$_k$".

The four block select transistors 35 included in the transistor group TG2 are respectively electrically connected to different word lines WL in the same memory block MB. For example, the four block select transistors 35 included in one of the transistor groups $TG2_B$ exemplified in FIG. 9B are respectively connected to the four word lines WL1, WL3, WL4, WL5 included in the memory block $MB_B$. Moreover, as exemplified in FIG. 11, the gate electrodes 106 of these four block select transistors 35 are all connected to a common block select line BLKSEL (common wiring). Therefore, if, for example, the block select line $BLKSEL_A$ is in an "H" state, then these four block select transistors 35 will be in an ON state. On the other hand, if, for example, the block select line $BLKSEL_A$ is in an "L" state, then these four block select transistors 35 will be in an OFF state. Hereafter, the transistor group TG2 corresponding to the memory block $MB_P$ (where P is A-H, for example) will sometimes be written as "transistor group $TG2_P$".

In the layout pattern exemplified in, for example, FIG. 9A, a plurality of the transistor groups $TG2_A$, $TG2_B$ corresponding to the memory blocks $MB_A$, $MB_B$ are aligned alternately in the X direction. Similarly, a plurality of the transistor groups $TG2_C$, $TG2_D$ corresponding to the memory blocks $MB_C$, $MB_D$ are aligned alternately in the X direction.

Note that "DS0", "DS1", "DD0", and "DD1" of FIG. 9B each indicate a dummy word line. The dummy word line has a similar configuration to the word line WL. However, whereas the word line WL is connected to the memory cell MC used as a memory, the dummy word line is connected to a dummy cell not used as a memory. Note that the dummy cell has the same configuration as the memory cell MC.

Moreover, "dummy" of FIG. 9B indicates a dummy transistor provided for easing a voltage difference between adjacent block select transistors 35. For example, the drawing exemplifies such a dummy transistor corresponds to the transistor group $TG1_0$, and that will be in an ON state during transfer of a voltage to the memory block $MB_C$.

Moreover, as shown in FIG. 9B, an end section in the X direction of the block select circuit section 231 may be provided with a transistor group TG1' that includes three block select transistors 35 having a common source region. Such a transistor group TG1' may be provided to an end section in the Y direction of the block select circuit section 231, or may be provided to a region other than an end section of the block select circuit section 231.

Moreover, the layout pattern described with reference to FIGS. 8-11 is merely an example, and there may be adopted a variety of layout patterns. For example, the transistor group TG2 may include: two block select transistors 35 adjacent in the Y direction via the insulating region STI; and two block select transistors 35 adjacent from one side and the other side in the X direction to these two block select transistors 35.

Advantages

Next, advantages of the semiconductor memory device according to the present embodiment will be described.

When, for example, the likes of a write operation or a read operation is performed by the configuration exemplified in FIG. 1, the block select transistors 35 included in one block selector 34 will be in an ON state, and the block select transistors 35 included in the other block selectors 34 will be in an OFF state, according to an output signal of the address decoder 22. Moreover, an operation voltage outputted from the operation voltage generating circuit 21 is transferred to the plurality of word lines WL included in one memory block MB, via the wirings CG, and so on. Meanwhile, the plurality of word lines WL included in the other memory blocks MB will be in a floating state.

Now, in the layout such as exemplified in FIG. 8, the four block select transistors 35 included in the transistor group TG2 are provided adjacently via the insulating region STI. In such a case as when, for example, a program voltage of about 20 V is transferred to one of these four block select transistors 35, and voltages of drain regions of the other three of these four block select transistors 35 are in a vicinity of a ground voltage, a large voltage is applied to the insulating region STI between the four block select transistors 35, and an insulation breakdown of the insulating region STI sometimes occurs. If an area of the insulating region STI is provided broadly in order to suppress this, then an increase in circuit area causes.

Accordingly, in the present embodiment, the four block select transistors 35 included in the transistor group TG2 are all corresponded to the same memory block MB. Such a configuration makes it possible to suppress a voltage difference between adjacent four block select transistors 35, makes it possible to reduce an area of the insulating region STI, and makes it possible to suppress an increase in circuit area.

Moreover, in the present embodiment, memory blocks MB adjacent in the Y direction correspond to different transistor groups TG1. That is, among block select transistors 35 included in two transistor groups TG1 corresponding to two memory blocks MB adjacent in the Y direction, none of four block select transistors 35 included in one transistor group TG1 includes a region common to any of four block select transistors 35 included in the other transistor group TG1. Such a configuration makes it possible to simultaneously transfer different voltages to the word lines WL included in two memory blocks MB adjacent in the Y direction. It is therefore possible to execute the likes of a test of withstand voltage between memory blocks MB or detection of a leak current.

OTHER EXAMPLES

Figure 12:
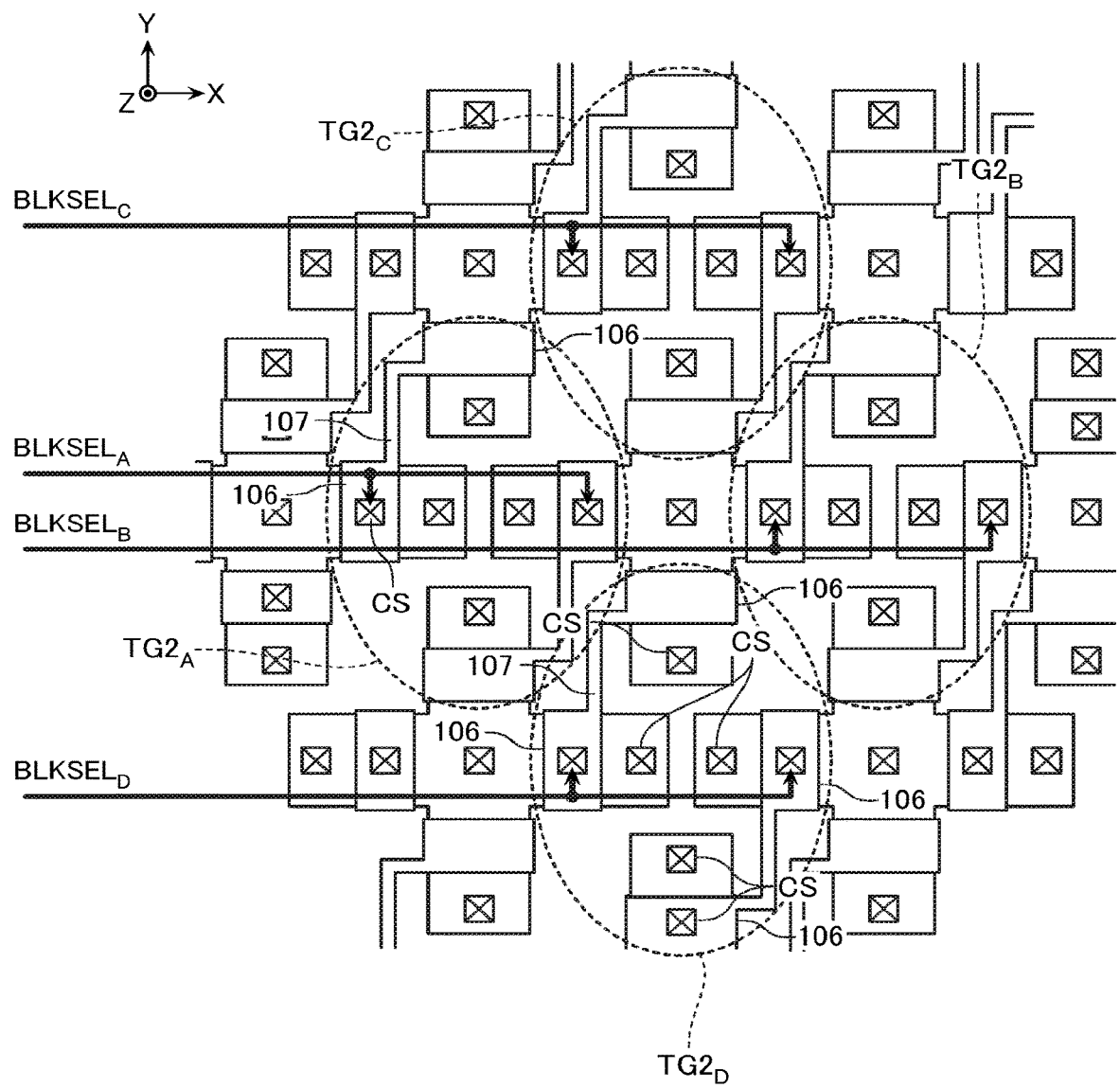
FIG. 12 is a schematic plan view for describing another example of the first embodiment.

In the example of FIG. 11, the gate electrodes 106 of the four block select transistors 35 included in the transistor group TG2 each have a contact CS connected thereto. However, as exemplified in, for example, FIG. 12, it is also possible to adopt an electrode film that includes: a first part functioning as the gate electrode 106 of one of the block select transistors 35 in one transistor group TG2; a second part functioning as the gate electrode 106 of another block select transistor 35 in the one transistor group TG2; and a connecting section 107 that connects the first and the second parts. In this configuration, a contact CS may be connected to one of the plurality of the gate electrodes 106 via the connecting section 107. Note that, the gate electrodes 106 and the connecting section 107 may be simultaneously formed.

Figure 13:
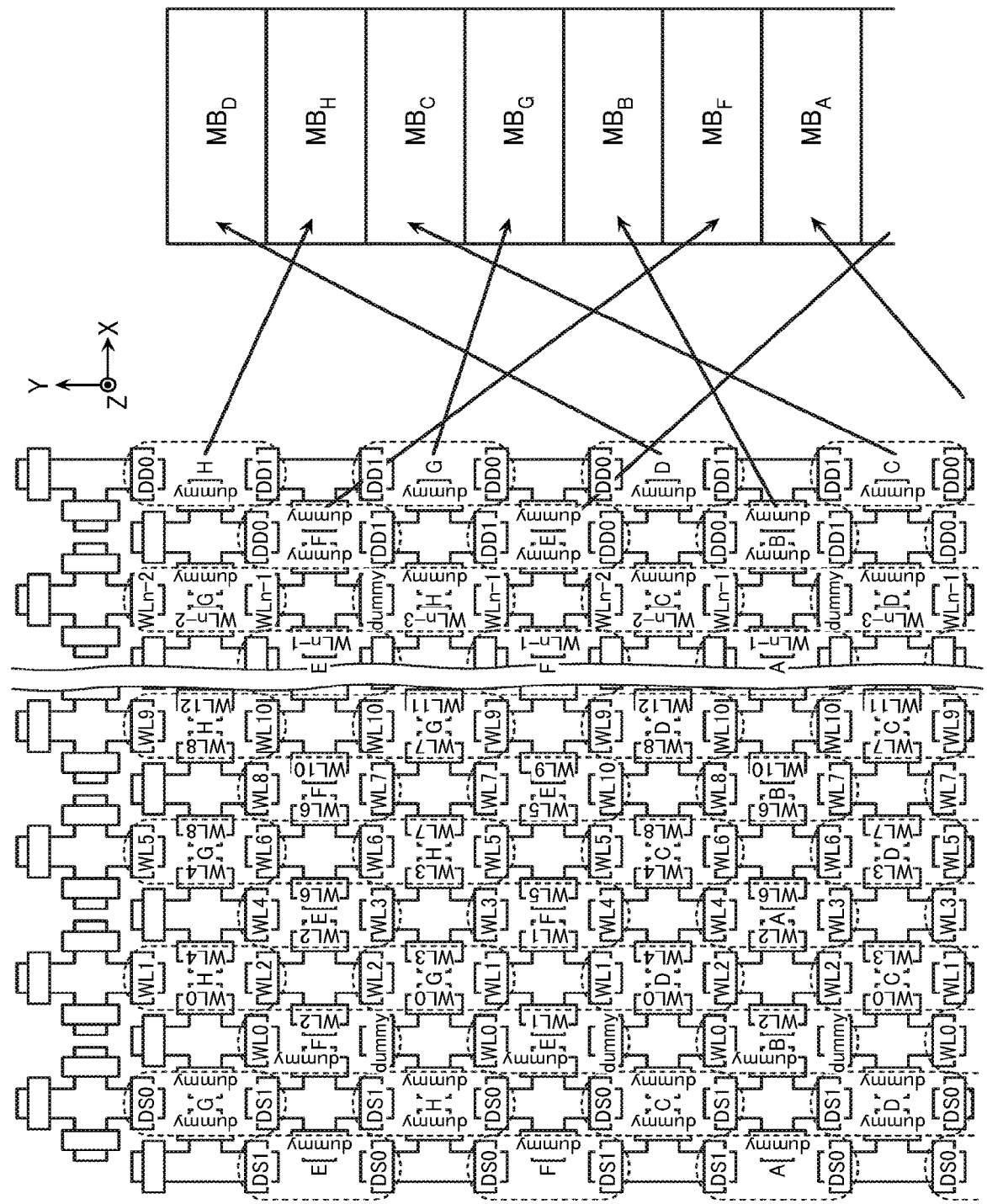
FIG. 13 is a schematic plan view for describing another example of the first embodiment.
Figure 14:
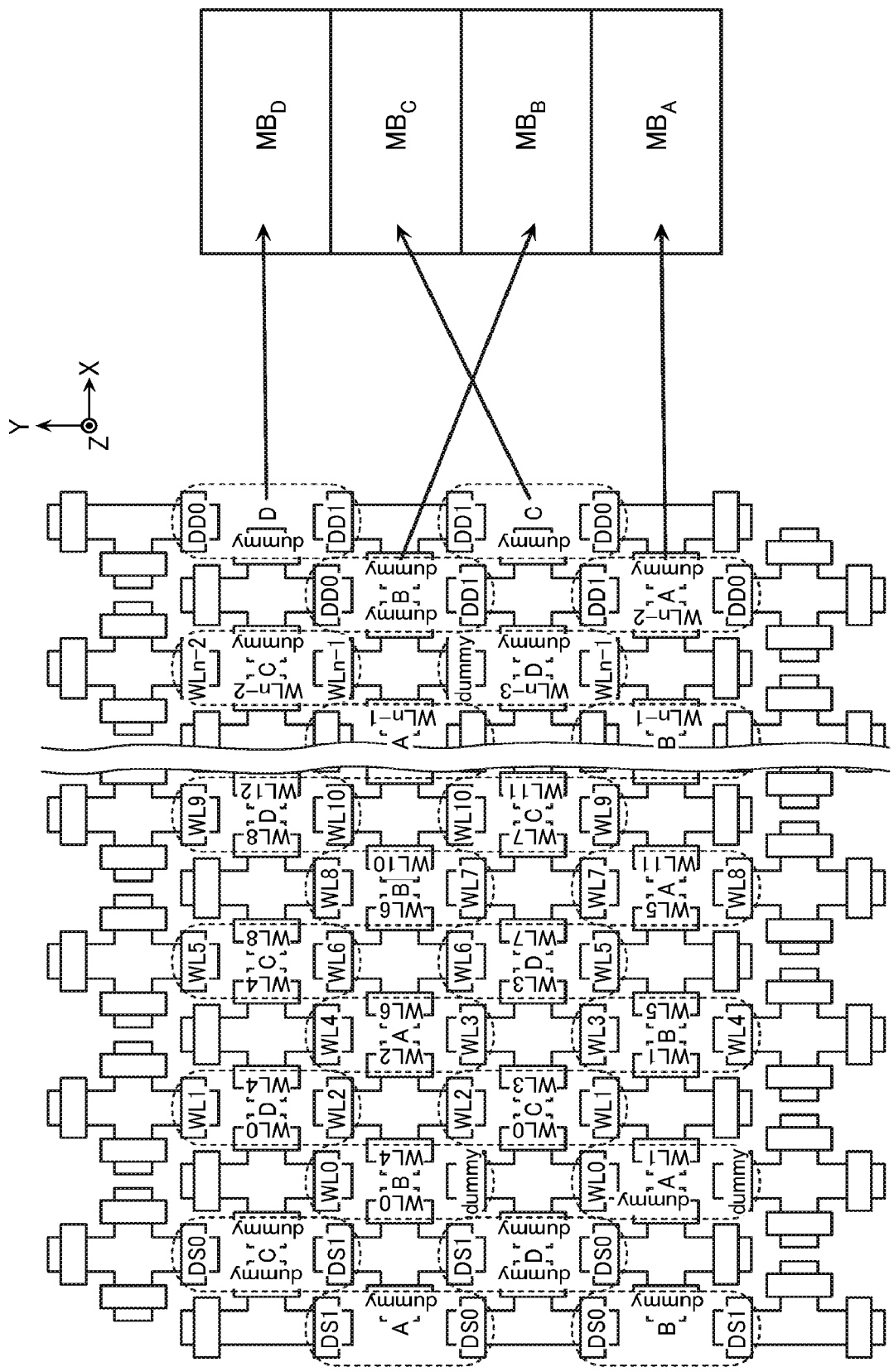
FIG. 14 is a schematic plan view for describing another example of the first embodiment.

Moreover, in the example of FIGS. 2, 9A, and 9B, the block select circuit section 231 is provided not only on one side in the X direction of the memory cell array MA, but also on the other side in the X direction of the memory cell array MA. However, the block select circuit section 231 may be provided only on one side in the X direction of the memory cell array MA. Even in such a case, as exemplified in, for example, FIG. 13, the memory blocks MB adjacent in the Y direction may be configured so as to correspond to different transistor groups TG1. Moreover, as exemplified in, for example, FIG. 14, the memory blocks MB adjacent in the Y direction may be configured so as to correspond to the same transistor group TG1.

Moreover, when, for example, the write operation is performed in a NAND type flash memory, the program voltage is transferred to a selected word line WL, and the write pass voltage is transferred to at least some of a plurality of unselected word lines WL. At this time, those positioned between the selected word line WL and the drain select line SGD, of the plurality of unselected word lines WL all have the write pass voltage transferred thereto. On the other hand, those positioned between the selected word line WL and the source select line SGS, of the plurality of unselected word lines WL may have a voltage transferred thereto in a variety of modes. For example, such unselected word lines WL may all have the write pass voltage transferred thereto. Moreover, when, for example, one of the four block select transistors 35 included in the transistor group TG2 corresponds to the selected word line WL, the unselected word lines WL corresponding to the other three may have the write pass voltage transferred thereto. Moreover, other unselected word lines WL may have transferred thereto a ground voltage or a voltage close to the ground voltage.

Second Embodiment

Overall Configuration

Next, a configuration of a semiconductor memory device according to a second embodiment will be described. Note that in the description below, portions similar to in the first embodiment will be assigned with the same reference symbols as in the first embodiment, and descriptions thereof will be omitted.

Figure 15:
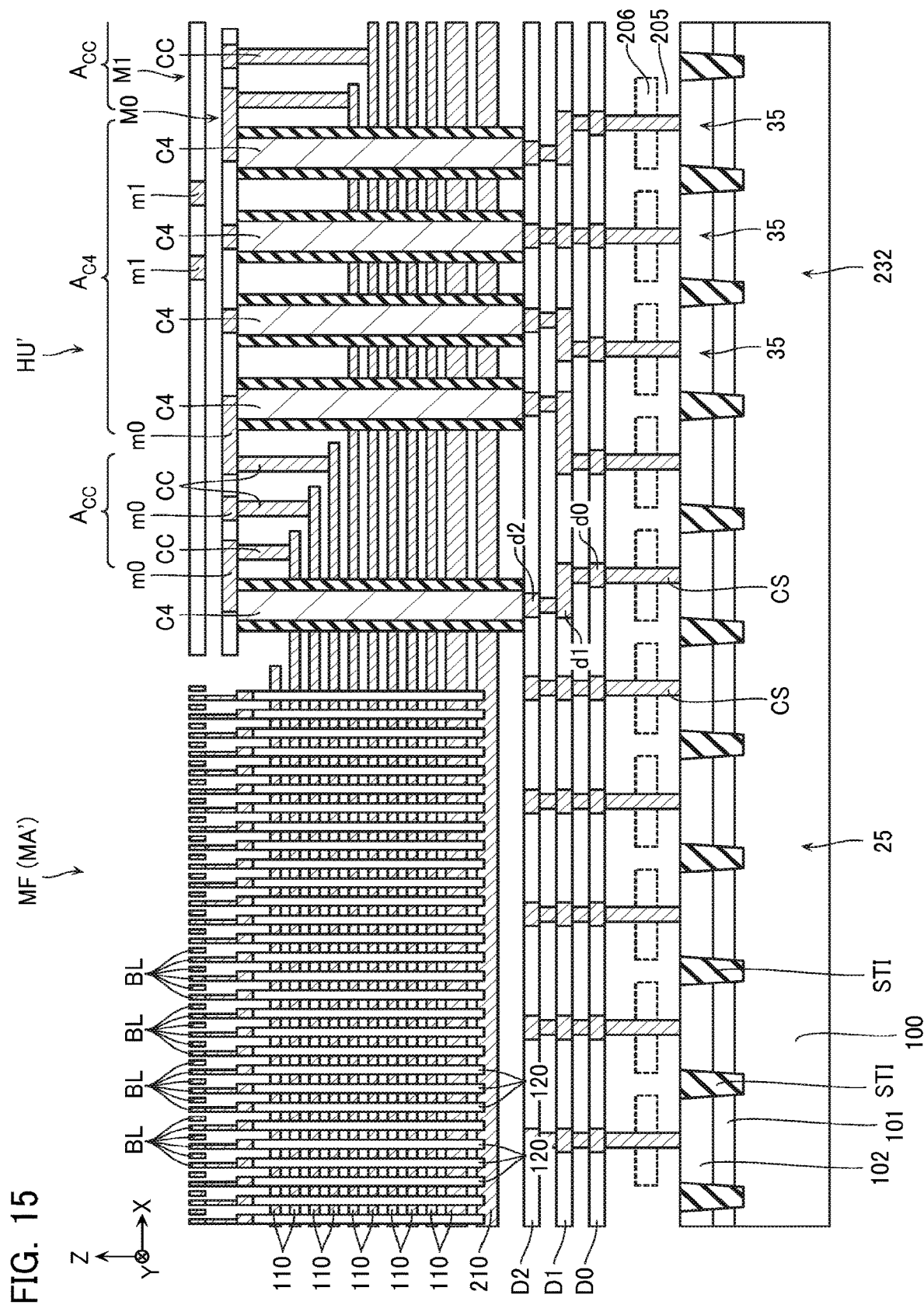
FIG. 15 is a cross-sectional view showing a schematic configuration of a semiconductor memory device according to a second embodiment.

FIG. 15 is a cross-sectional view for describing the configuration of the semiconductor memory device according to the present embodiment.

Figure 16:
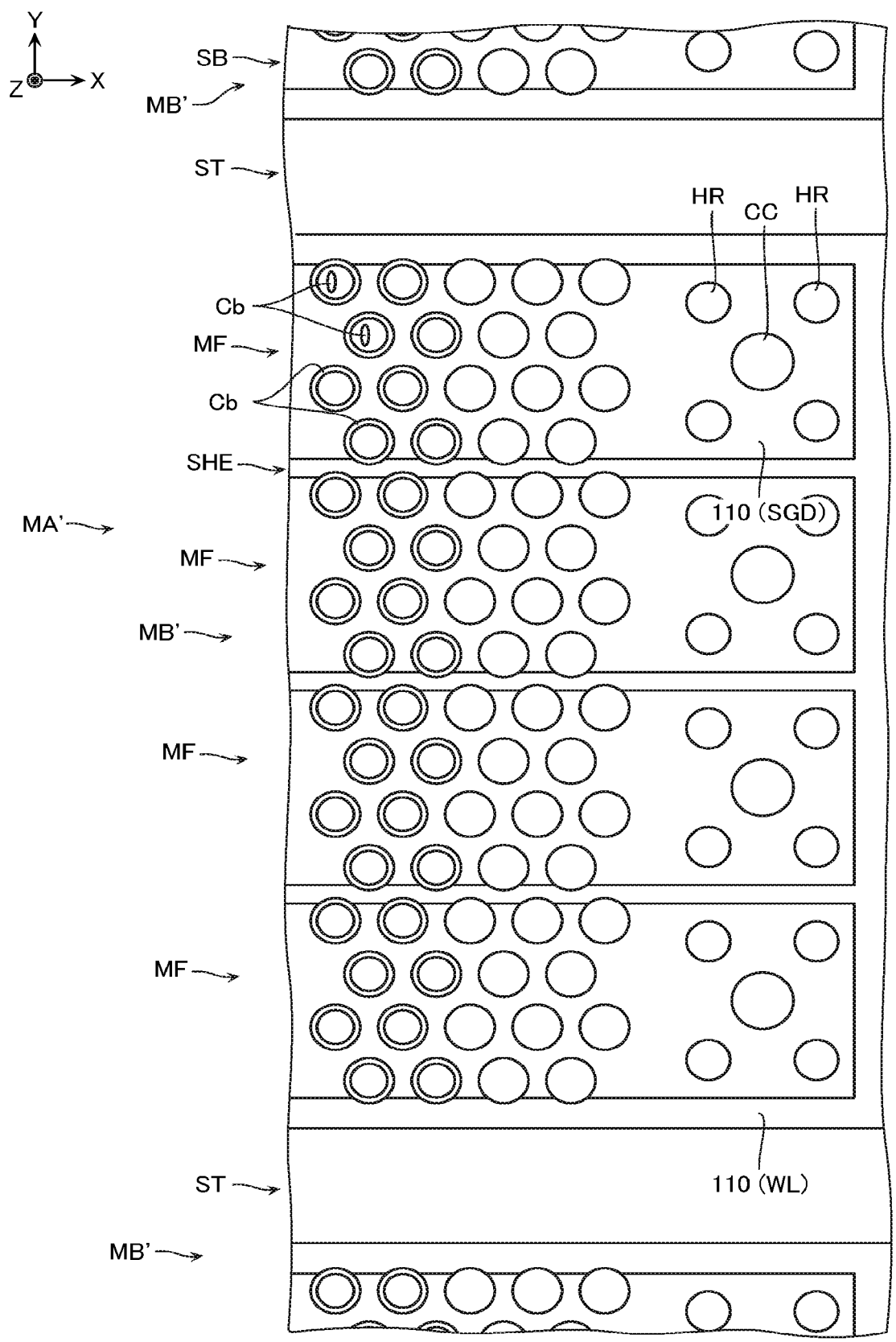
FIG. 16 is a schematic plan view of same semiconductor memory device.

As exemplified in FIG. 6, and so on, in the first embodiment, the memory cell array MA was provided on the surface of the semiconductor substrate 100. That is, the lower end section of the semiconductor column 120 was connected to the surface of the semiconductor substrate 100 via the semiconductor layer 122. In contrast, as exemplified in FIG. 15, a memory cell array MA' according to the present embodiment is provided separated from the surface of the semiconductor substrate 100 in the Z direction. That is, a conductive layer 210 functioning as the source line SL is provided above the semiconductor substrate 100, and the lower end section of the semiconductor column 120 is connected to this conductive layer 210. The conductive layer 210 includes, for example, a laminated film of titanium nitride and tungsten, heavily doped polycrystalline silicon or a silicide, or a laminated film including these. Note that as exemplified in FIG. 16, a memory block MB' according to the present embodiment does not include the inter-sub-block insulating layer ST' (FIG. 3).

Moreover, as exemplified in FIG. 15, a hookup HU' according to the present embodiment includes: a first area $A_{CC}$ where end sections in the X direction of a plurality of the conductive layers 110 are provided; the contacts CC connected to the plurality of conductive layers 110 in this first area $A_{CC}$; a second area $A_{C4}$ where a through-hole is provided in the plurality of conductive layers 110; a contact C4 provided on an inside of this through-hole; and the wiring layers M0, M1 provided above these areas and contacts. These plurality of conductive layers 110 are electrically connected to the Z direction-extending contact C4, via the Z direction-extending contact CC and a plurality of the wirings m0, m1 included in the wiring layers M0, M1.

Moreover, in the second embodiment, a region where the memory cell array MA' is provided and a region where the hookup HU' is provided, of the surface of the semiconductor substrate 100 are provided with a plurality of transistors. Of these plurality of transistors, those provided in the same region as the memory cell array MA' configure part of the sense amplifier 25, and so on, for example. Those provided in the same region as the hookup HU' function as the block select transistors 35, for example. Moreover, wiring layers D0, D1, D2 are provided above these plurality of transistors. The source region and the drain region of the block select transistor 35 are electrically connected to the contact C4, via a plurality of the contacts CS extending in the Z direction and a plurality of wirings d0, d1, d2 included in the wiring layers D0, D1, D2.

Block Select Circuit Section 232

Figure 17:
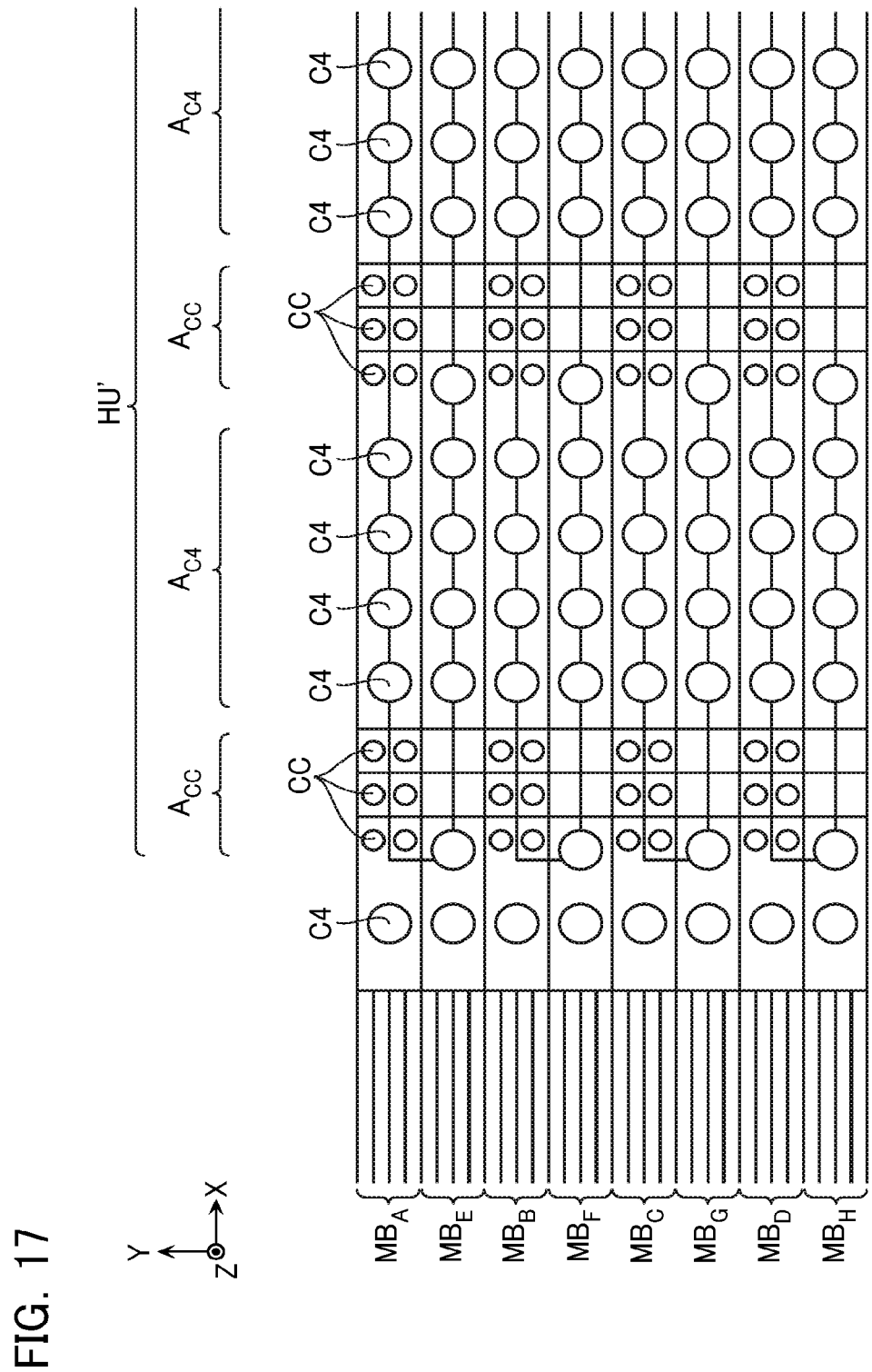
FIG. 17 is a schematic plan view of same semiconductor memory device.
Figure 18:
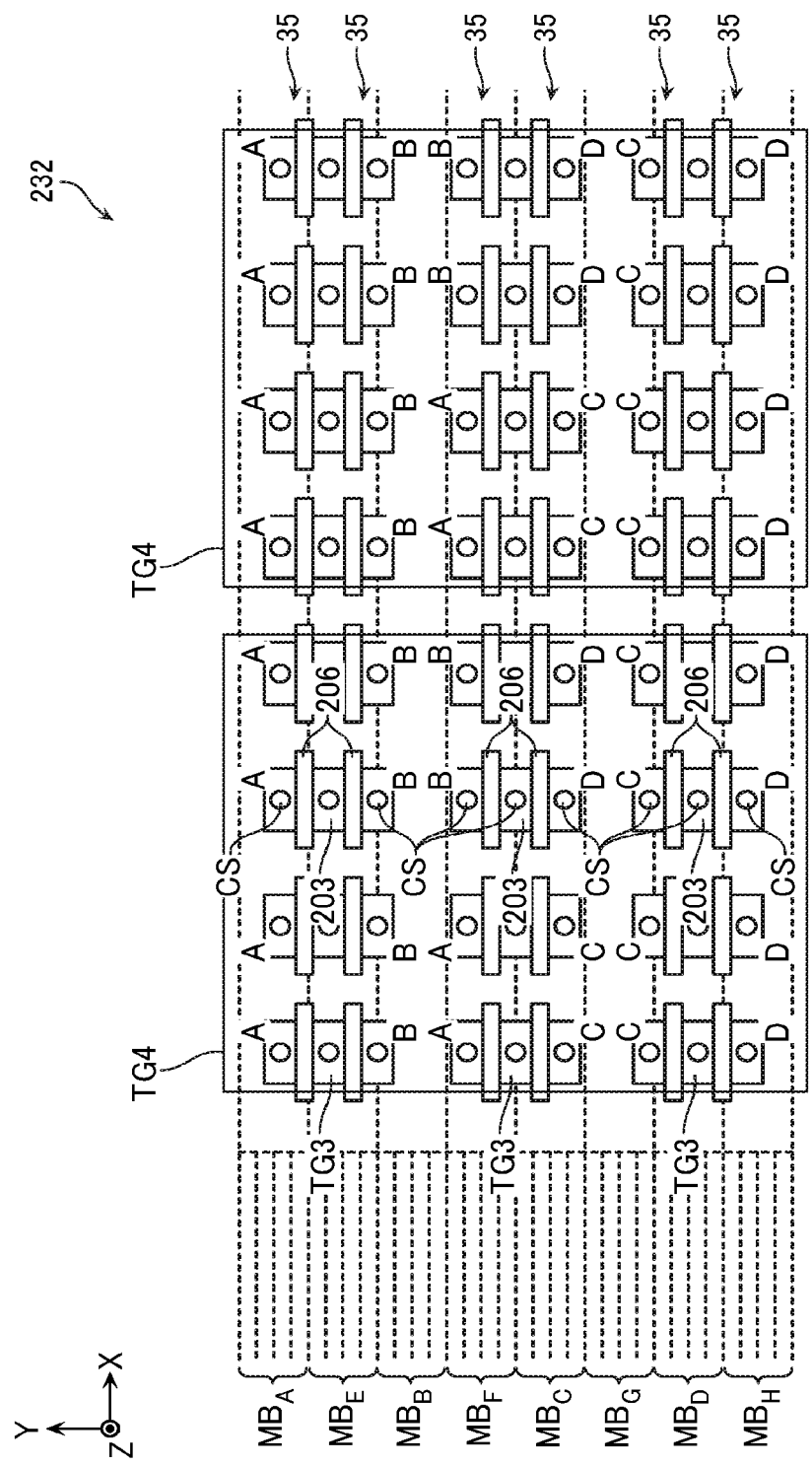
FIG. 18 is a schematic plan view of same semiconductor memory device.
Figure 19:
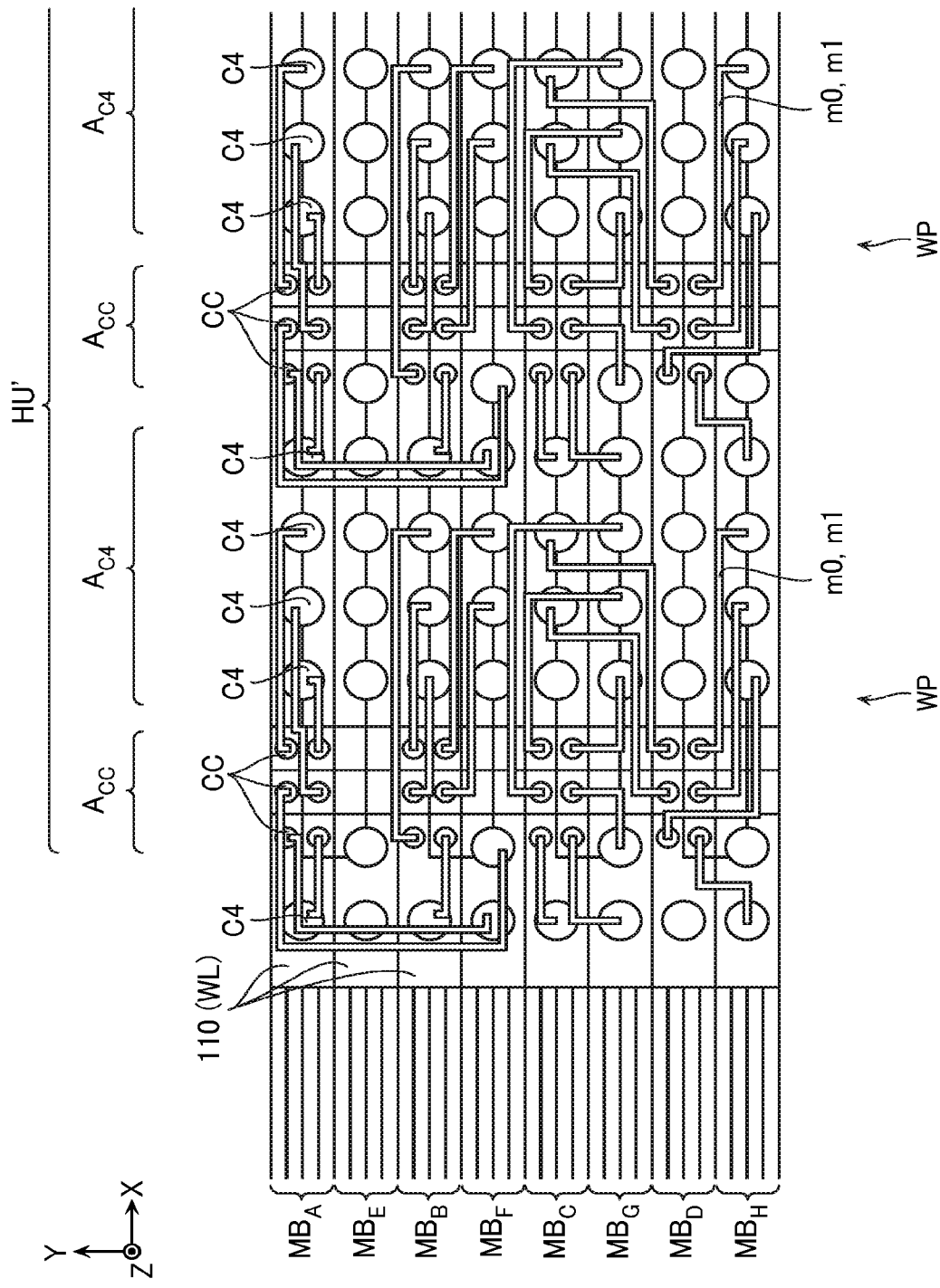
FIG. 19 is a schematic plan view of same semiconductor memory device.
Figure 20:
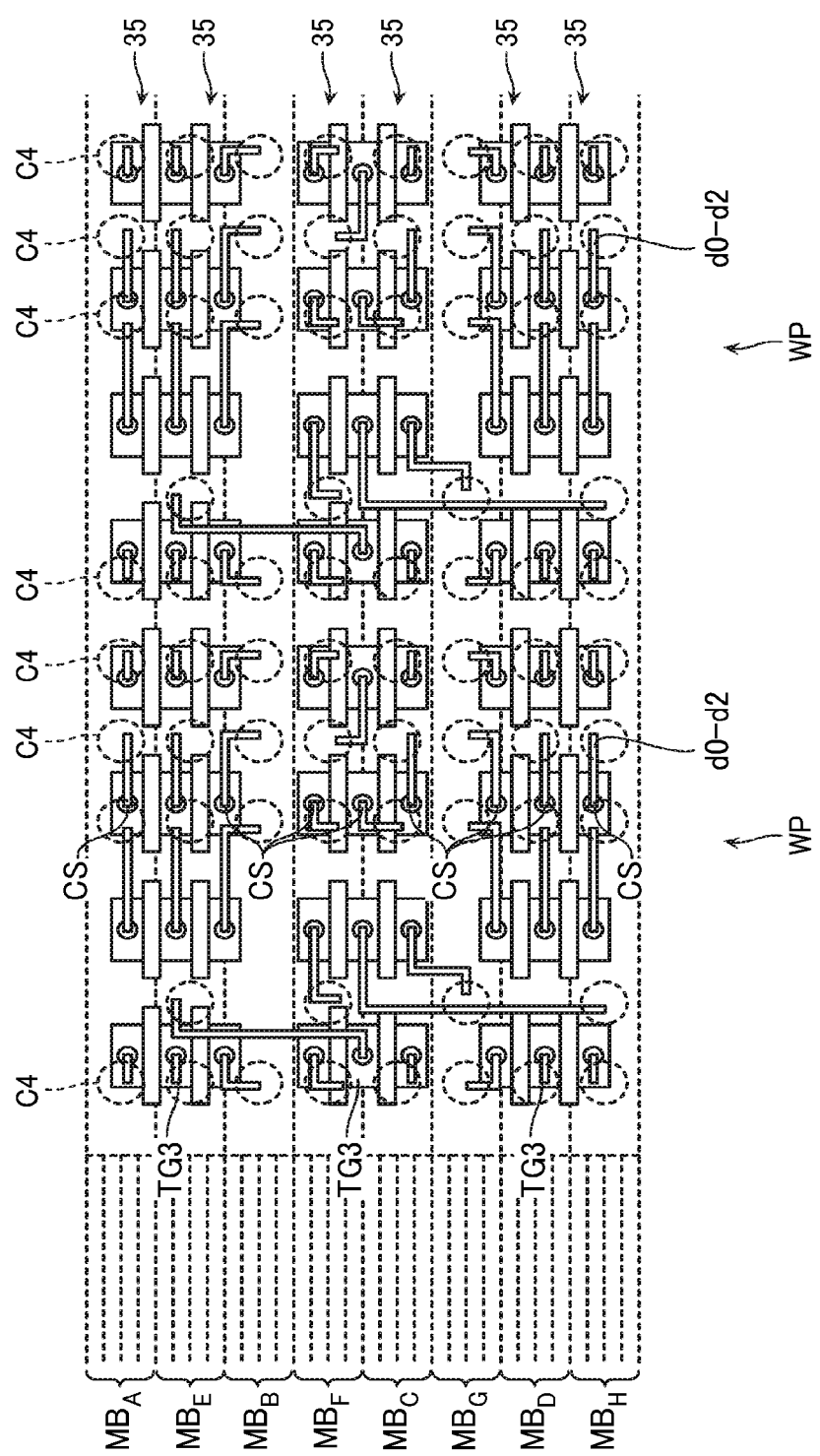
FIG. 20 is a schematic plan view of same semiconductor memory device.

Next, a configuration example of a block select circuit section 232 according to the present embodiment will be described with reference to FIGS. 17-20. FIG. 17 is a schematic plan view showing part of the hookup HU'. FIG. 18 is a schematic plan view of the block select circuit section 232. Note that in FIG. 18, dotted lines indicating boundaries of the memory blocks MB, and so on, are shown in order to explain a correspondence relationship with the hookup HU'. Moreover, FIGS. 19 and 20 are views corresponding to FIGS. 17 and 18. FIGS. 19 and 20 illustrate the wirings d0, d1, d2, m0, m1, and so on. Note that FIGS. 17-20 show a schematic configuration, and that a specific configuration may be appropriately changed. Moreover, in FIGS. 17-20, part of the configuration is omitted.

FIG. 17 exemplifies eight memory blocks $MB_A$, $MB_E$, $MB_B$, $MB_F$, $MB_C$, $MB_G$, $MB_D$, $MB_H$ provided continuously in the Y direction. Moreover, FIG. 17 shows the hookup HU' provided on one end side in the X direction of the memory cell array MA'. The first area $A_{CC}$ is provided with a plurality of the contacts CC aligned in a matrix in the X direction and the Y direction. The second area $A_{C4}$ is provided with a plurality of the contacts C4 aligned in a matrix in the X direction and the Y direction.

FIG. 18 shows a portion corresponding to the structure shown in FIG. 17, of the block select circuit section 232. The block select circuit section 232 is a configuration for achieving the block select circuit 23 of FIG. 1, and, as exemplified in FIG. 18, includes a plurality of the block select transistors 35. The drawing shows two block select transistors 35 having a common source region. Hereafter, such two block select transistors 35 will be called a "transistor group TG3". Moreover, a plurality of these transistor groups TG3 form a plurality of groups corresponding to the first area $A_{CC}$ of the hookup HU'. Hereafter, such a plurality of transistor groups TG3 will be called a "transistor group TG4". A plurality of the transistor groups TG4 are aligned in the X direction.

The transistor group TG3 includes a semiconductor region 203 extending in the Y direction. Moreover, both end sections in the Y direction of the semiconductor region 203 are each provided with a contact CS functioning as a drain terminal of the block select transistor 35. Moreover, these contacts CS have provided between them a contact CS that functions as a common source terminal of the two block select transistors 35. Moreover, the contacts CS functioning as the drain terminals and the contact CS functioning as the source terminal each have provided between them a gate insulating film 205 (FIG. 15) and a gate electrode 206.

The transistor group TG4 includes a plurality of the transistor groups TG3 aligned in a matrix in the X direction and the Y direction. That is, the transistor group TG4 includes a plurality of subgroups configured from a plurality of the transistor groups TG3 aligned in the X direction. The transistor groups TG3 included in the first subgroup, of these subgroups are respectively connected to the word lines WL corresponding to the memory blocks $MB_A$, $MB_B$, via the contacts CS, and so on. The transistor groups TG3 included in the third subgroup are respectively connected to the word lines WL corresponding to the memory blocks $MB_C$, $MB_D$, via the contacts CS, and so on.

The second subgroup includes a plurality at a time (in the illustrated example, two each) of the transistor groups TG3 corresponding to the memory blocks $MB_A$, $MB_C$ and the transistor groups TG3 corresponding to the memory blocks $MB_B$, $MB_D$. The plurality of transistor groups TG3 corresponding to the memory blocks $MB_A$, $MB_C$ are provided continuously in the X direction. Similarly, the plurality of transistor groups TG3 corresponding to the memory blocks $MB_B$, $MB_D$ too are provided continuously in the X direction.

Hereafter, the transistor group TG3 corresponding to the memory blocks $MB_P$, $MB_Q$ (where P, Q are, for example, A-H) will sometimes be written as "transistor group $TG3_{PQ}$".

FIGS. 19 and 20 show a configuration example of the wirings d0-d2, m0, m1. In the illustrated example, the wiring layers D0-D2, M0, M1 include a plurality of the same wiring patterns WP. These plurality of wiring patterns WP are each provided correspondingly to the transistor group TG4 and the first area $A_{CC}$ of the hookup HU'. In this wiring pattern, the drain regions of the block select transistors 35 are electrically connected to the corresponding word lines WL, via the contact CS, the wirings d0-d2, the contact C4, the wirings m0, m1, and the contact CC. Moreover, the source region of the block select transistors 35 is electrically connected to an unillustrated wiring CG, via the contact CS, the wirings d0-d2, and the contact C4. The wiring CG may be provided above the wiring layers M0, M1, for example.

Advantages

Next, advantages of the semiconductor memory device according to the present embodiment will be described.

In order to highly integrate the semiconductor memory device, it is desirable that a configuration in the memory cell array MA is made smaller. On the other hand, a configuration for achieving the likes of the block select circuit 23 is sometimes difficult to highly integrate, from a viewpoint of withstand voltage, and so on. As a result, as shown in, for example, FIG. 18, there sometimes occurs an irregular pattern of the kind where three transistor groups TG3 aligned in the Y direction correspond to eight memory blocks MB aligned in the Y direction.

Figure 21:
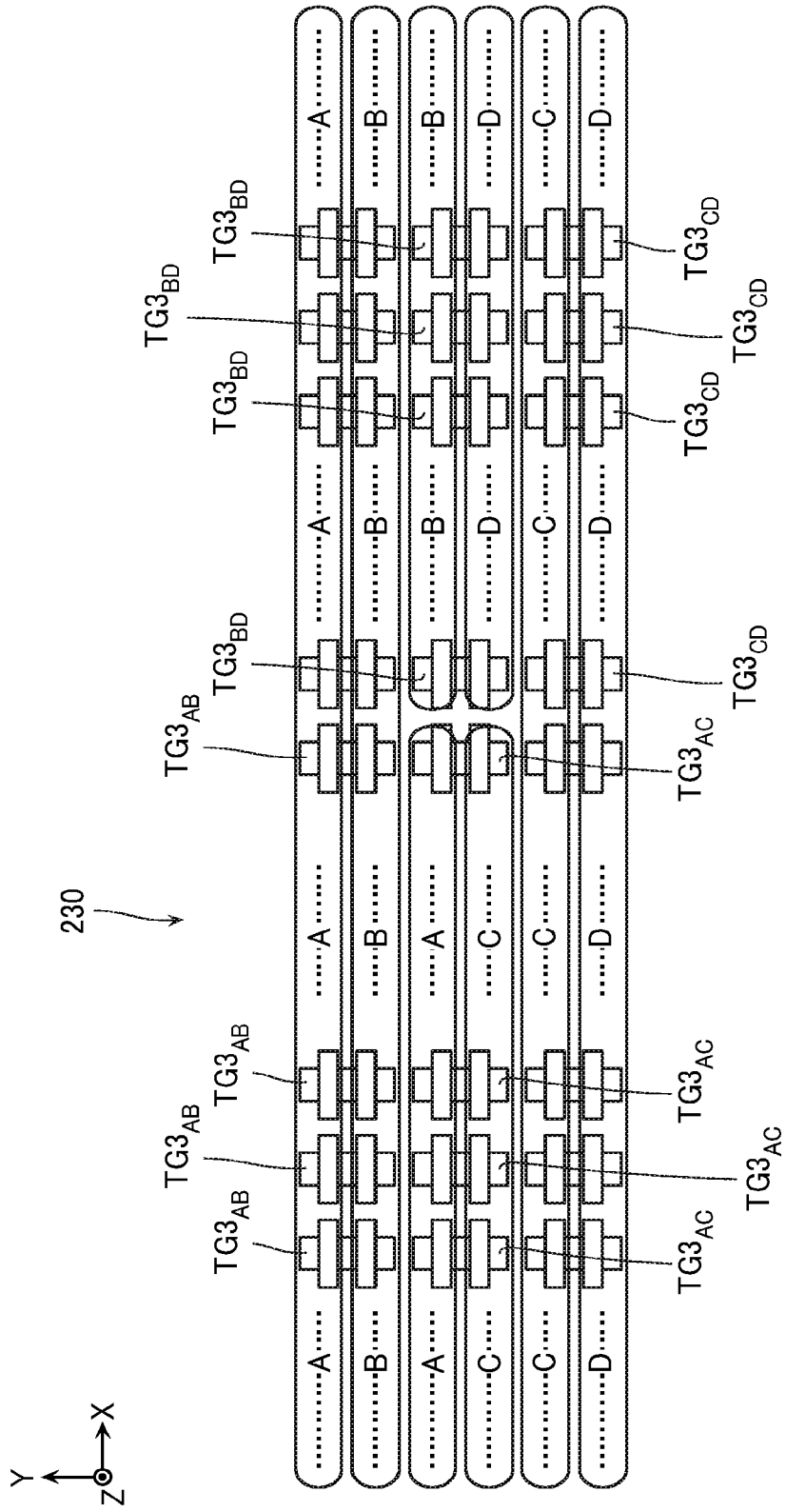
FIG. 21 is a schematic plan view of a semiconductor memory device according to a comparative example.

In such a case, it is conceivable to adjust a correspondence relationship of the memory blocks MB and the transistor groups TG3, in a mode of the kind exemplified in FIG. 21, for example. That is, a block select circuit section 230 exemplified in FIG. 21, similarly to the block select circuit section 232 (FIG. 18), includes a plurality of subgroups configured from a plurality of the transistor groups TG3 aligned in the X direction. Of these subgroups, the first subgroup is provided with the transistor group $TG3_{AB}$, the second subgroup is provided with the transistor groups $TG3_{AC}$, $TG3_{BD}$, and the third subgroup is provided with the transistor group $TG3_{CD}$. Now, in the example of FIG. 21, in the second subgroup, all of the transistor groups $TG3_{AC}$ are provided continuously in the X direction. Moreover, all of the transistor groups $TG3_{BD}$ are provided continuously in the X direction.

In such a mode, it is possible to suppress a voltage difference between the block select transistors 35 adjacent in the X direction, in the above-described second subgroup. However, sometimes, a distance in the X direction between some of the contacts CC and the block select transistors 35 corresponding to these contacts CC gets too large, which leads to complication and routing congestion of the wiring pattern. Furthermore, sometimes, in the case where, for example, the number of conductive layers 110 included in the memory block MB is large, there is also a possibility that there is needed a new wiring layer, in addition to the wiring layers D0-D2, M0, M1, which leads to an increase in manufacturing costs.

Due to the semiconductor memory device according to the present embodiment, the block select transistors 35 corresponding to each of the memory blocks MB are provided dispersed in the X direction, thereby enabling such complication and routing congestion of the wirings to be suppressed.

Moreover, in the present embodiment, two memory blocks MB adjacent in the Y direction correspond to different transistor groups TG3. Hence, similarly to in the first embodiment, it is possible to execute the likes of a test of withstand voltage between memory blocks MB or detection of a leak current.

OTHER EXAMPLES

The configurations shown in FIGS. 17-20 are merely exemplifications, and may be appropriately changed.

Figure 22:
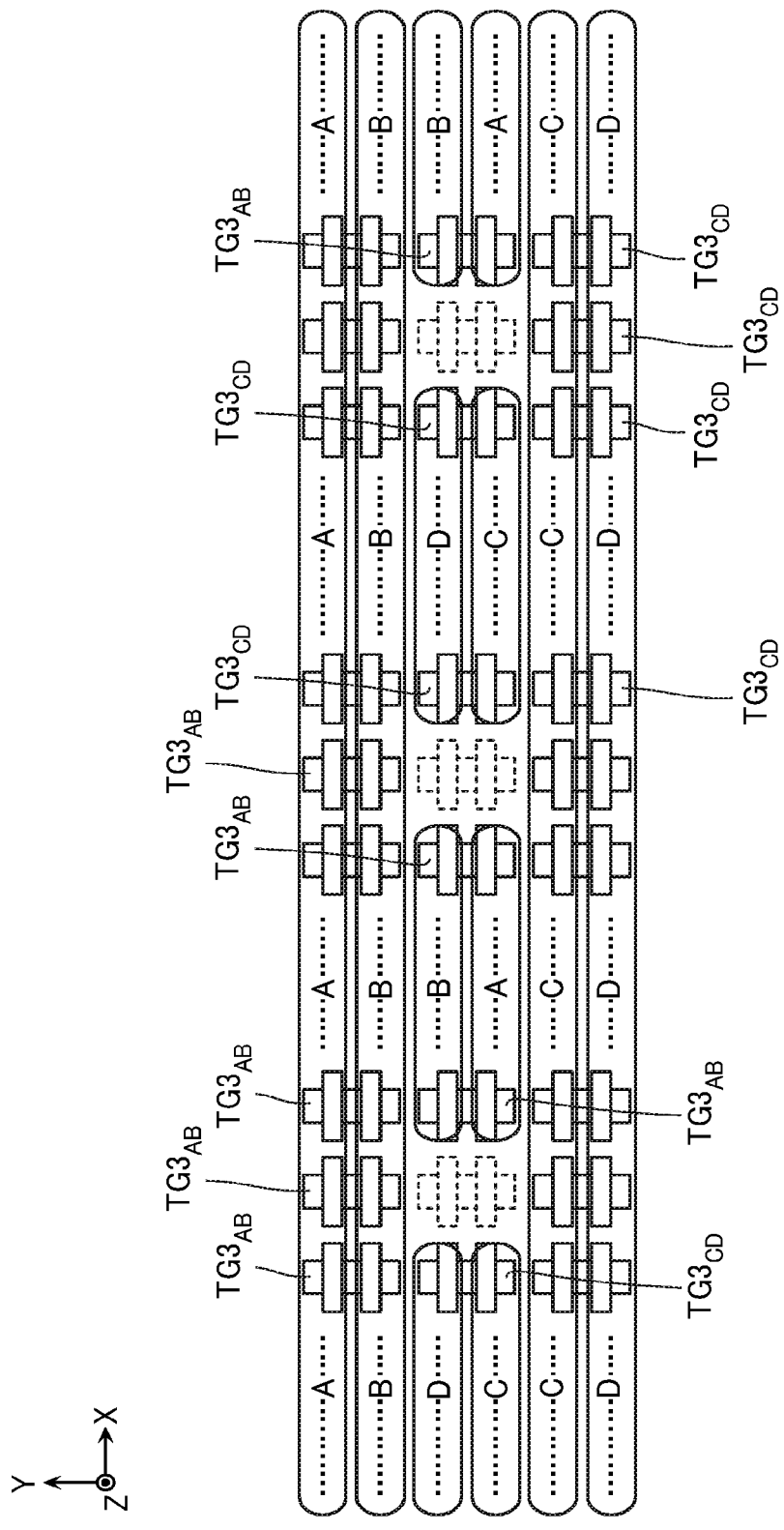
FIG. 22 is a schematic plan view for describing another example of the second embodiment.

For example, in the example of FIG. 18, the plurality of transistor groups TG3 included in the block select circuit section 232 are aligned at fixed intervals in the X direction and the Y direction. However, an interval between the transistor groups TG3 (a width of the insulating region STI) may be appropriately changed according to withstand voltage, and so on. For example, as in FIG. 22, an interval between the transistor group $TG3_{AB}$ and the transistor group $TG3_{CD}$ may be made larger than an interval between the transistor group $TG3_{AB}$ and the transistor group $TG3_{AB}$. In the example of FIG. 22, such a configuration is achieved by omitting some of the transistor groups TG3 included in the above-described second column, of the plurality of matrix-aligned transistor groups TG3. Such a configuration makes it possible for the withstand voltage between transistor groups TG3 corresponding to different memory blocks MB to be improved in the above-described second column.

Figure 23:
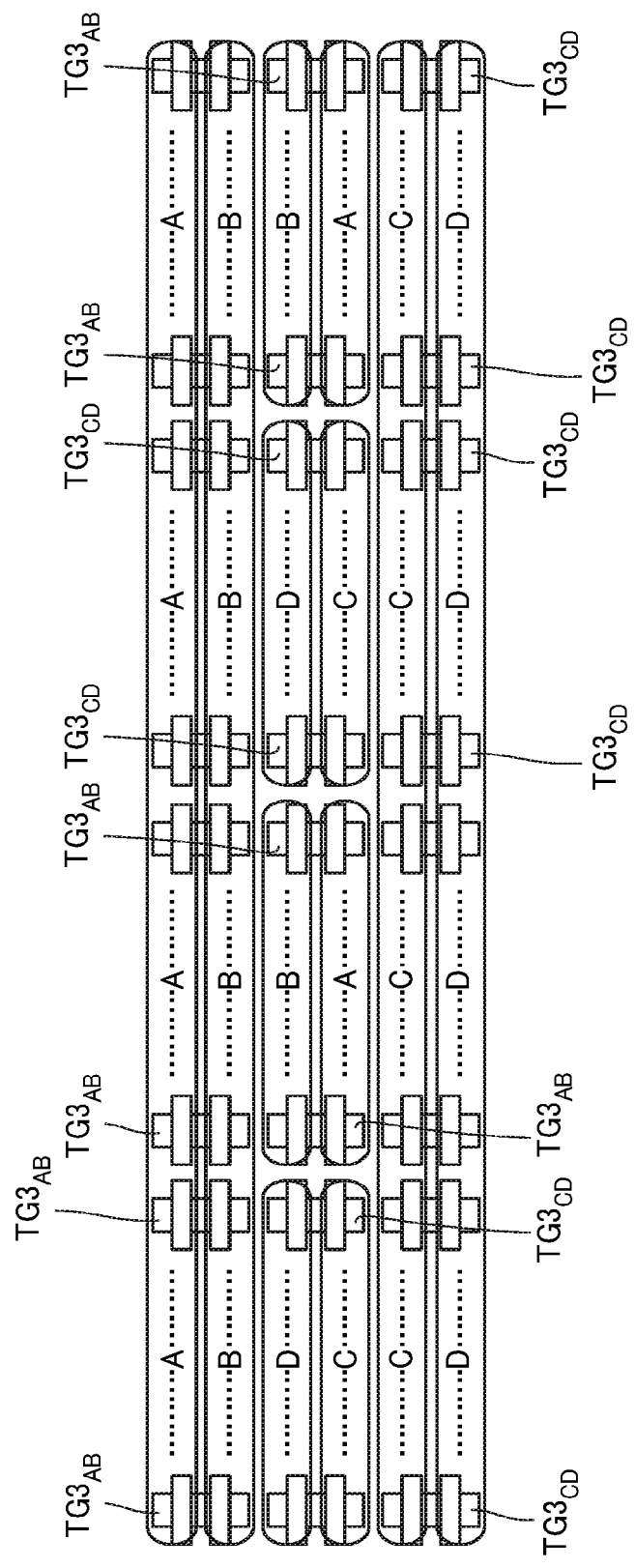
FIG. 23 is a schematic plan view for describing another example of the second embodiment.

Moreover, as exemplified in, for example, FIG. 23, the above-described second subgroup may include the transistor group $TG3_{AB}$ and the transistor group $TG3_{CD}$.

Figure 24:
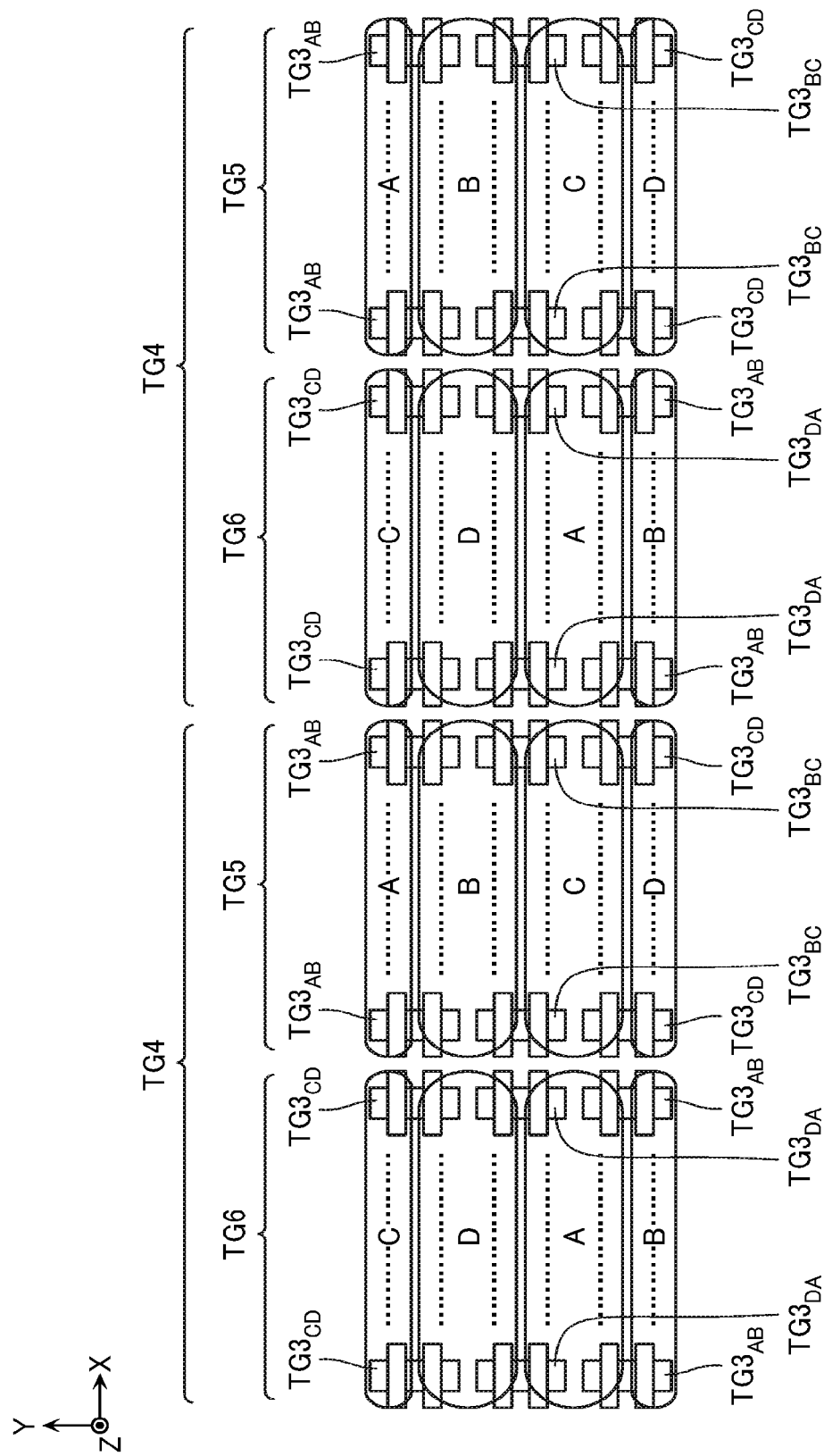
FIG. 24 is a schematic plan view for describing another example of the second embodiment.

Moreover, as exemplified in, for example, FIG. 24, a configuration may be adopted whereby all of the block select transistors 35 included in the transistor group TG4 are adjacent to block select transistors 35 corresponding to the same memory block MB, in both the X direction and the Y direction. Such a configuration makes it possible for the voltage difference between the plurality of block select transistors 35 adjacent in the X direction and the Y direction to be suppressed, makes it possible for the area of the insulating region STI to be reduced, and makes it possible for an increase in circuit area to be suppressed.

Note that in the example of FIG. 24, the transistor group TG4 includes transistor groups TG5, TG6 aligned in the X direction. A first subgroup of the transistor group TG5 includes a plurality of the transistor groups TG3$_{AB}$, its second subgroup includes a plurality of the transistor groups TG3$_{BC}$, and its third subgroup includes a plurality of the transistor groups TG3$_{CD}$. A first subgroup of the transistor group TG6 includes a plurality of the transistor groups TG3$_{CD}$, its second subgroup includes a plurality of the transistor groups TG3$_{DA}$, and its third subgroup includes a plurality of the transistor groups TG3$_{AB}$.

Figure 25:
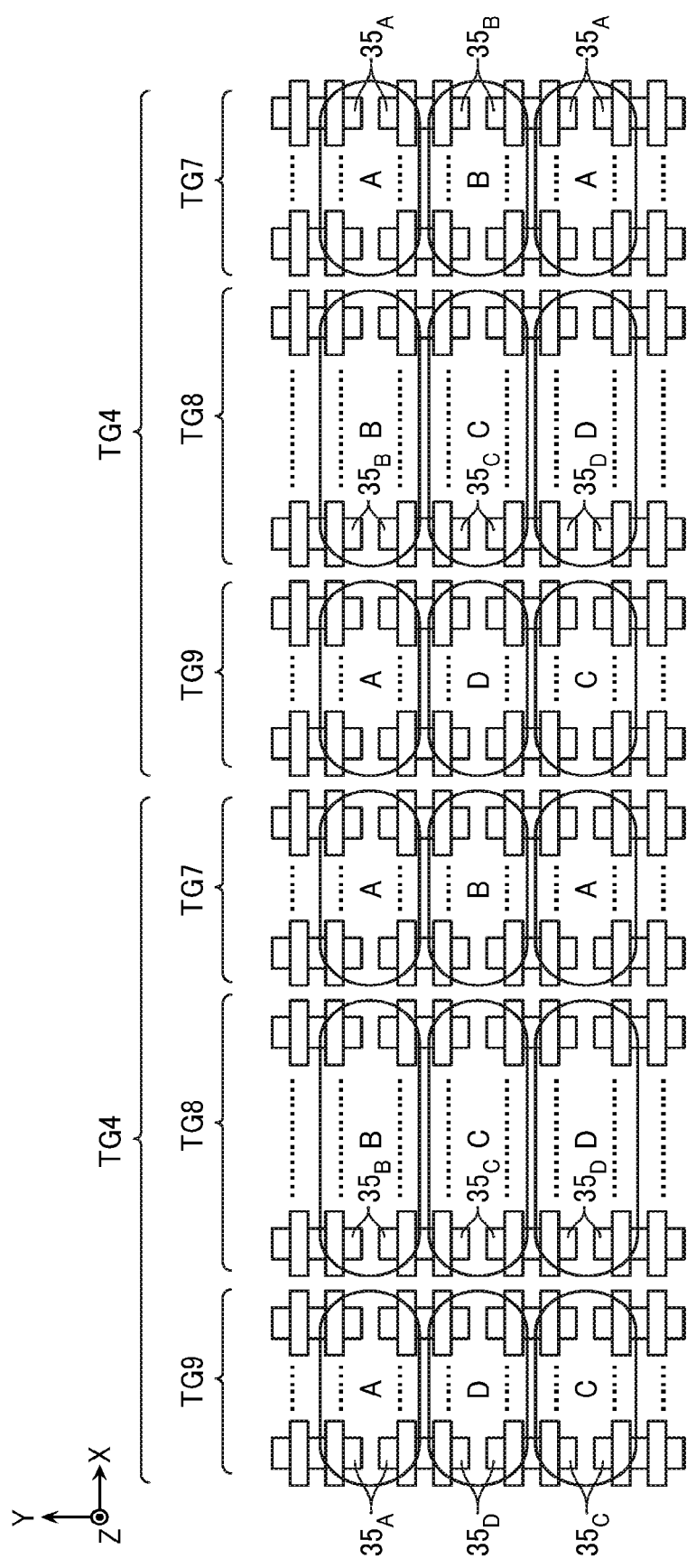
FIG. 25 is a schematic plan view for describing another example of the second embodiment.

Moreover, as exemplified in FIG. 25, a configuration may be adopted whereby some of the transistor groups TG3 straddle two transistor groups TG4 adjacent in the Y direction. Such a configuration makes it possible for the voltage difference between two transistor groups TG4 adjacent in the Y direction to be suppressed, makes it possible for the area of the insulating region STI to be reduced, and makes it possible for an increase in circuit area to be suppressed.

In the example of FIG. 25, similarly to in the example of FIG. 24, all of the block select transistors 35 included in the transistor group TG4 are adjacent to block select transistors 35 corresponding to the same memory block MB, in both the X direction and the Y direction.

Moreover, in the example of FIG. 25, the transistor group TG4 includes three transistor groups TG7, TG8, TG9 aligned in the X direction. Now, if the block select transistor 35 corresponding to the memory block MB$_X$ (where X is, for example, A-H) is written as "block select transistor 35$_X$", then the transistor group TG7 includes two subgroups at a time of subgroups of a plurality of the block select transistors 35$_A$, 35$_B$, 35$_A$, from one side to the other side in the Y direction. Moreover, the transistor group TG8 includes two subgroups at a time of subgroups of a plurality of the block select transistors 35$_B$, 35$_C$, 35$_D$, from one side to the other side in the Y direction. Moreover, the transistor group TG9 includes two subgroups at a time of subgroups of a plurality of the block select transistors 35$_A$, 35$_D$, 35$_C$, from one side to the other side in the Y direction.

Moreover, in the second embodiment too, similarly to in the first embodiment, there may be provided a connecting section that connects the gate electrodes 206 of the block select transistors 35 corresponding to the same memory block MB. Moreover, a contact CS may be connected to one of a plurality of the gate electrodes 206 that have been connected via this connecting section.

Moreover, in the second embodiment too, similarly to in the first embodiment, the block select circuit section 232 may be provided on one side and the other side in the X direction of the memory cell array MA', or the block select circuit section 232 may be provided only on one side in the X direction of the memory cell array MA'. In whichever case, the memory blocks MB adjacent in the Y direction may be configured to correspond to different transistor groups TG3, or may be configured to correspond to the same transistor group TG3.

Moreover, in the second embodiment too, similarly to in the first embodiment, the voltage applied to the unselected word lines WL during the write operation may be appropriately changed. For example, those positioned between the selected word line WL and the source select line SGS, of the plurality of unselected word lines WL may all have the write pass voltage transferred thereto. Moreover, in the examples of FIGS. 24 and 25, for example, the plurality of block select transistors 35 corresponding to the same memory block MB are provided adjacently to each other. When, for example, one of such a plurality of block select transistors 35 has the program voltage transferred thereto, the remaining block select transistors 35 may have the write pass voltage transferred thereto. Moreover, other unselected word lines WL may have transferred thereto a ground voltage or a voltage close to the ground voltage.

OTHER EMBODIMENTS

That concludes description of the first and second embodiments. However, these configurations are merely exemplifications, and specific configurations may be appropriately changed.

Figure 26:
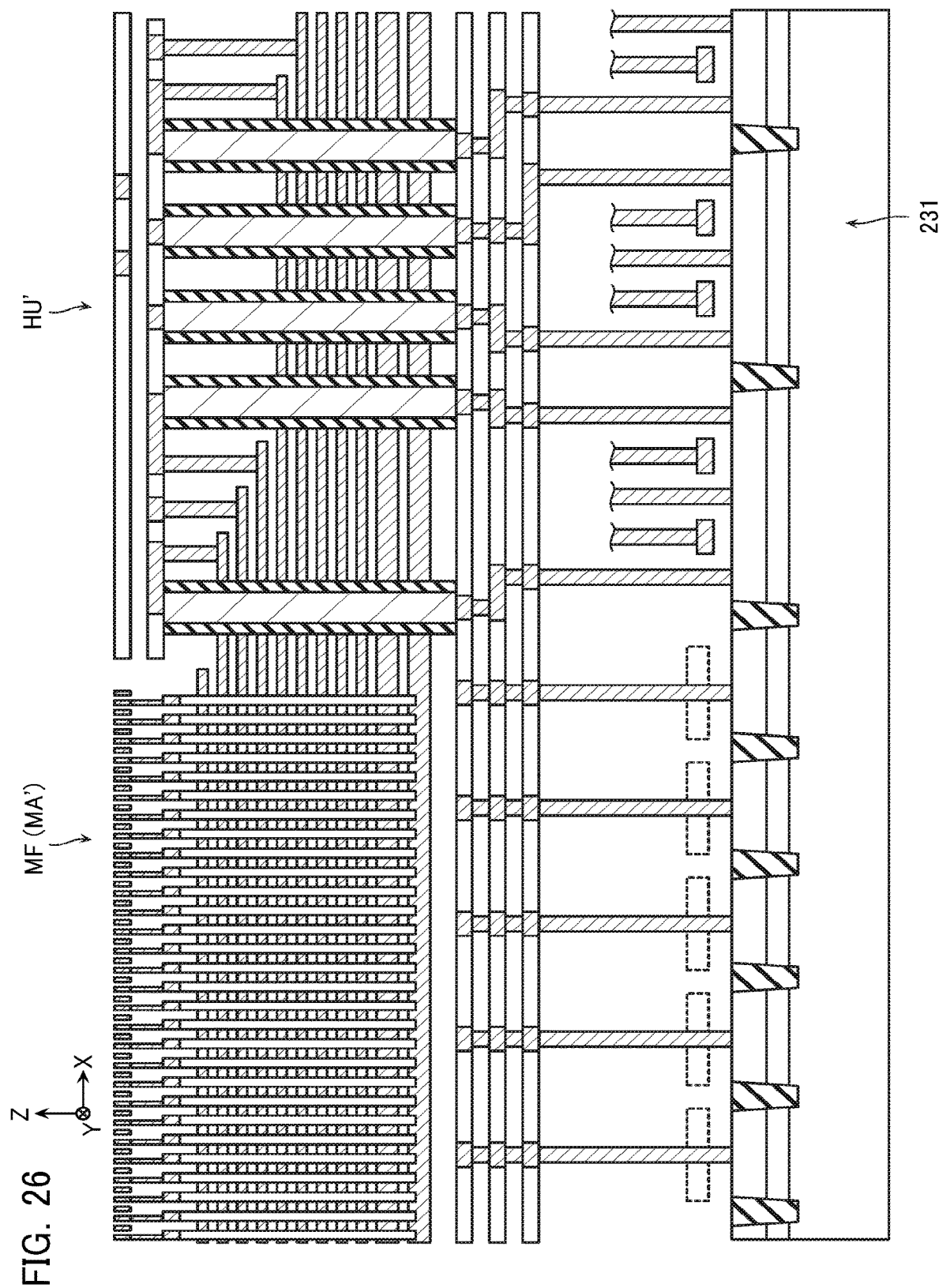
FIG. 26 is a schematic cross-sectional view for describing another embodiment.

For example, in the first embodiment, the memory cell array MA was provided on the surface of the semiconductor substrate 100. However, as exemplified in, for example, FIG. 26, it is also possible to adopt the memory cell array MA' provided separated from the surface of the semiconductor substrate 100 in the Z direction similarly to in the second embodiment, even when the block select circuit section 231 according to the first embodiment is used. Similarly, it is also possible for the hookup HU' according to the second embodiment to be adopted in the first embodiment.

Moreover, in the second embodiment, for example, as described with reference to FIGS. 17-20, a layout of the contacts CC, C4 in the hookup HU', a layout of the transistor group TG3, and a layout in the wiring layers D0-D2, M0, M1 were all configured from a periodic pattern. However, some or all of these need not have a periodic pattern.

Figure 27:
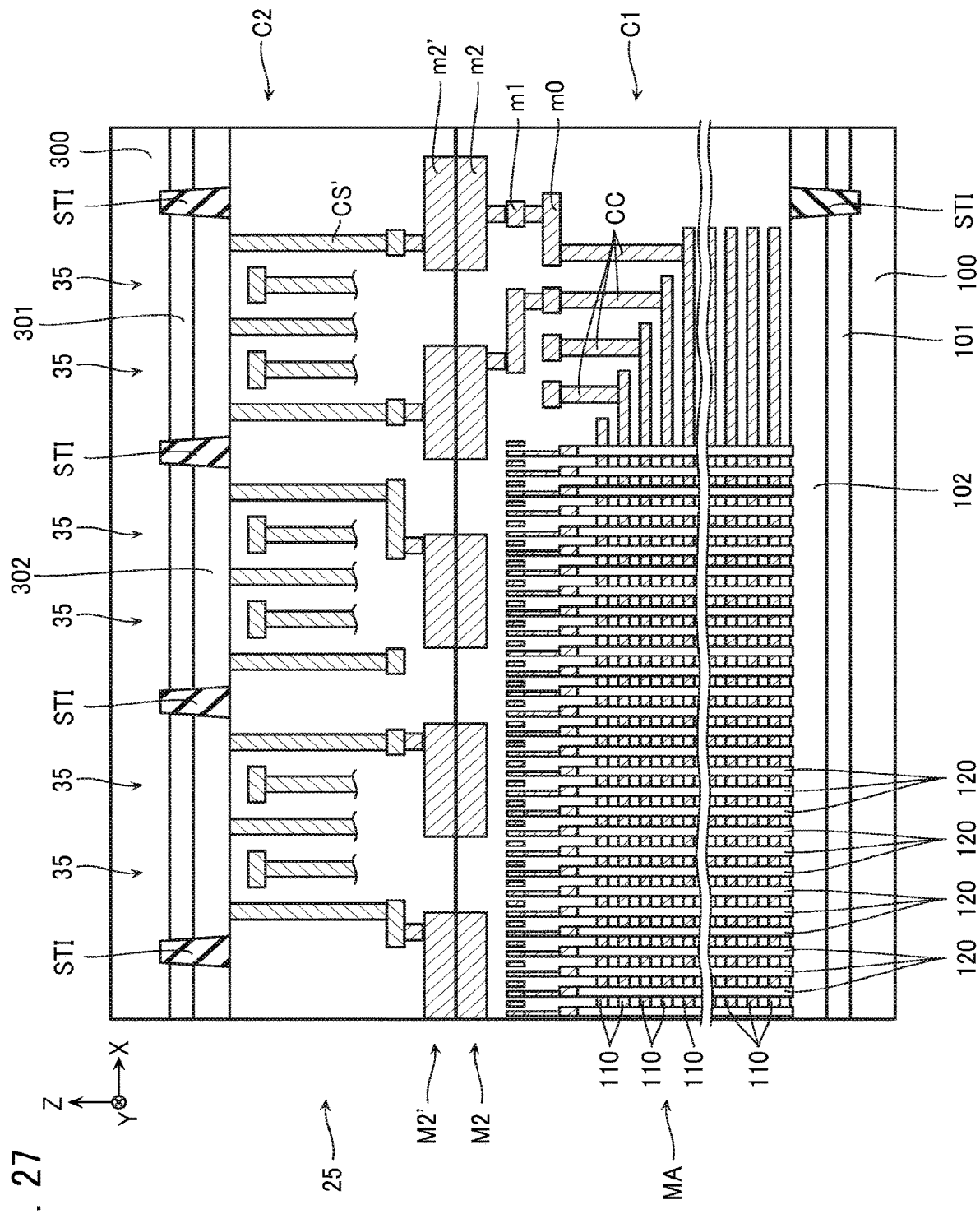
FIG. 27 is a schematic cross-sectional view for describing another embodiment.

Moreover, in the first and second embodiments, both the memory cell array MA and the block select circuit 23 were provided on one semiconductor substrate 100. However, in the first and second embodiments, a semiconductor substrate 300 where the block select circuit 23 is provided may be provided separately from a substrate where the memory cell array MA is provided, as exemplified in FIG. 27. Hereafter, such a configuration including the memory cell array MA will be called a "first chip C1". Additionally, such a configuration including the block select circuit 23 will be called a "second chip C2".

A first chip C1 includes: a substrate; a memory cell array MA provided on a substrate; and a plurality of wirings connected to each configuration (bit lines BL, source lines SL, word lines WL, and select gate lines (SGD, SGS)) included in memory cell array MA.

A variety of substrates may be used as the substrate where the memory cell array MA is provided. For example, in the example of FIG. 27, the semiconductor substrate 100 similar to those of the first and second embodiments is employed as such a substrate. However, a substrate other than a semiconductor substrate, such as a glass substrate, may be employed as the substrate where the memory cell array MA is provided. In such a case, the conductive layer 210 exemplified in FIG. 15, for example, may be employed. As mentioned above, the conductive layer 210 functions as the source line SL, and is connected to the lower end section (the upper end section when referring to the semiconductor substrate 300) of the semiconductor column 120.

A plurality of the conductive layers 110 are provided on the semiconductor substrate 100. The plurality of the conductive layers 110 are electrically connected to a wiring m2 (a first pad electrode) included in a wiring layer M2, via the contact CC, and the wirings m0, m1.

A second chip C2 includes: a semiconductor substrate 300; at least some part of the peripheral circuit PC provided on the semiconductor substrate 300; and a plurality of wirings connected to at least some part of the configuration (block select transistors 35, for example) included in the peripheral circuit PC.

The semiconductor substrate 300 is a semiconductor substrate of the likes of single crystal silicon including a P type impurity, for example. Part of a surface of the semiconductor substrate 300 is provided with an N type well 301 including an N type impurity such as phosphorus. Moreover, part of a surface of the N type well 301 is provided with a P type well 302 including a P type impurity such as boron. Moreover, part of the surface of the semiconductor substrate 300 is provided with the insulating region STI of $SiO_2$ or the like. A region not provided with the insulating region STI, of the surface of the semiconductor substrate 300 will sometimes be called a semiconductor region.

The surface of the semiconductor substrate 300 is provided with a plurality of the block select transistors 35. Drain regions of these plurality of block select transistors 35 are connected to a wiring m2' (a second pad electrode) included in a wiring layer M2', via the contact CS' extending in the Z direction.

Moreover, the first chip C1 and the second chip C2 are provided so that the wiring m2 (the first pad electrode) faces the wiring m2' (the second pad electrode), and the plurality of wirings m2 are electrically connected to the plurality of wirings m2'. Note that in the illustrated example, the plurality of wirings m2 are directly connected to the plurality of wirings m2', respectively. However, the plurality of wirings m2 may be connected to the plurality of wirings m2', via bump electrodes, conductive columns, or the like.

Figure 28:
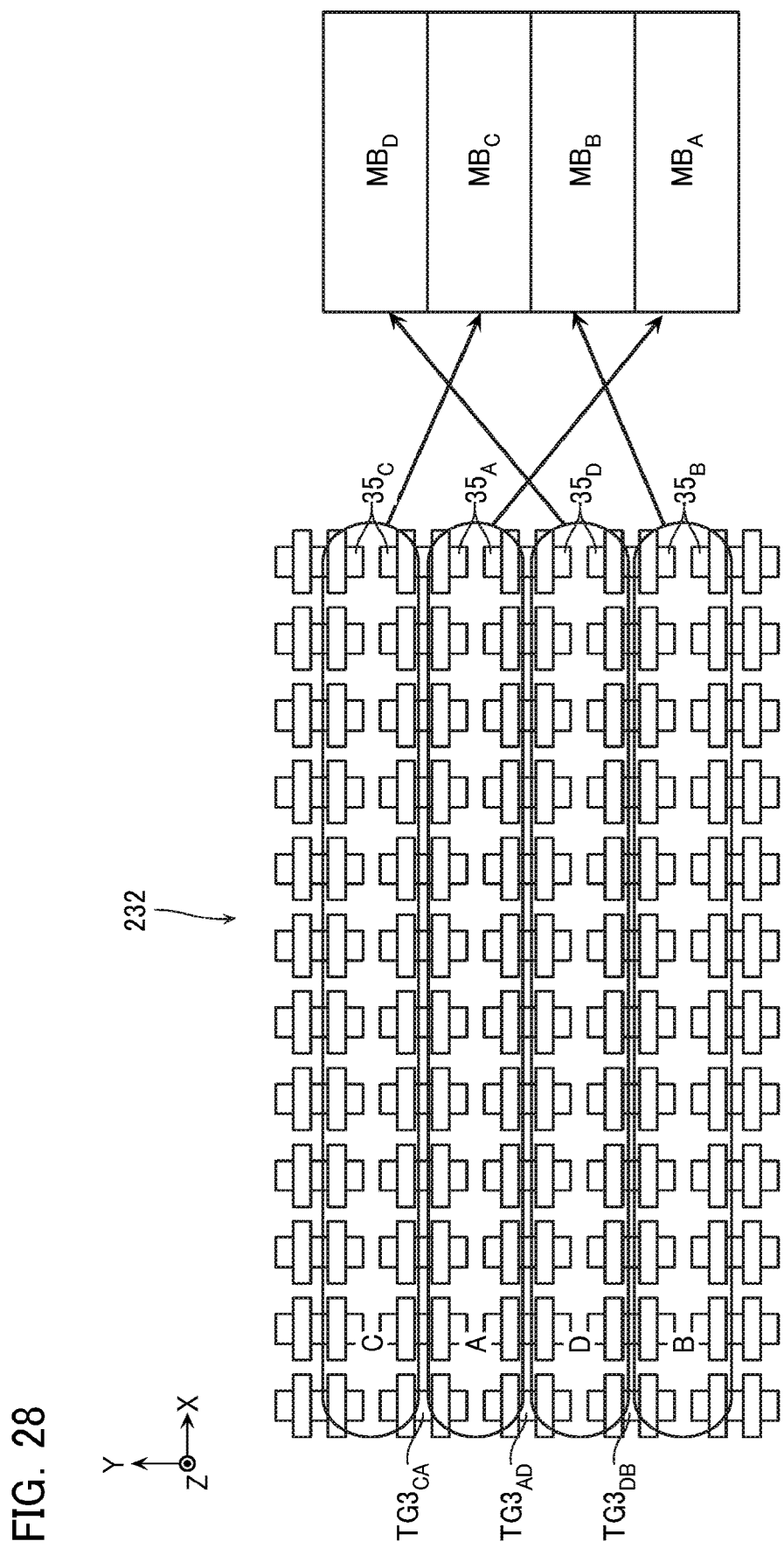
FIG. 28 is a schematic cross-sectional view for describing another embodiment.

Moreover, as mentioned above, in the first and second embodiments, the memory blocks MB adjacent in the Y direction correspond to different transistor groups TG1, TG3. Hence, it is possible to execute the likes of a test of withstand voltage between memory blocks MB or detection of a leak current. Such a configuration can also be achieved in a mode different from the first and second embodiments. For example, FIG. 28 exemplifies four memory blocks $MB_A$, $MB_B$, $MB_C$, $MB_D$ aligned in the Y direction. Moreover, in the example of FIG. 28, subgroups of eight block select transistors 35 aligned in the Y direction correspond to these four memory blocks $MB_A$, $MB_B$, $MB_C$, $MB_D$. FIG. 28 exemplifies a configuration including two subgroups at a time of subgroups of a plurality of the block select transistors $35_C$, $35_A$, $35_D$, $35_B$. Moreover, FIG. 28 exemplifies a configuration of the kind where some of the transistor groups TG3 straddle two transistor groups TG4 adjacent in the Y direction.

Moreover, in the first and second embodiments, a semiconductor memory device including a NAND type flash memory was described. However, the present invention may be applied to a memory other than a NAND type flash memory, or may be applied to a semiconductor device other than a memory.

Others

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor substrate;
a plurality of transistors provided on a surface of the semiconductor substrate; and
a first circuit electrically connected to gate electrodes of the plurality of transistors,
the plurality of transistors including:
a first transistor and a second transistor that are adjacent via an insulating region in a first direction;
a third transistor that is adjacent to the first transistor and the second transistor via the insulating region in a second direction intersecting the first direction; and
a fourth transistor that is adjacent to the first transistor and the second transistor via the insulating region in the second direction,
the first circuit
setting the first through fourth transistors to an ON state according to a first signal,
wherein the plurality of transistors include:
a fifth transistor that comprises a region common to the second transistor;
a sixth transistor that is adjacent to the fifth transistor via the insulating region in the first direction;
a seventh transistor that is adjacent to the fifth transistor and the sixth transistor via the insulating region in the second direction; and
an eighth transistor that is adjacent to the fifth transistor and the sixth transistor via the insulating region in the second direction, and
the first circuit
sets the fifth through eighth transistors to an OFF state according to the first signal, and
sets the fifth through eighth transistors to an ON state according to a second signal.

2. A semiconductor memory device comprising:
a semiconductor substrate;
first through fourth conductive layers aligned in a first direction intersecting a surface of the semiconductor substrate;
a first semiconductor column extending in the first direction and facing the first through fourth conductive layers;
a first insulating film provided between the first through fourth conductive layers and the first semiconductor column; and
a plurality of transistors provided on the surface of the semiconductor substrate,
the plurality of transistors comprising:
a first transistor that is electrically connected to the first conductive layer;
a second transistor that is electrically connected to the second conductive layer and is adjacent to the first transistor via an insulating region in a second direction intersecting the first direction;
a third transistor that is electrically connected to the third conductive layer and is adjacent to the first transistor and the second transistor via the insulating region in a third direction intersecting the first direction and the second direction; and
a fourth transistor that is electrically connected to the fourth conductive layer and is adjacent to the first transistor and the second transistor via the insulating region in the third direction.

3. The semiconductor memory device according to claim 2, comprising
a common wiring that is connected to gate electrodes of the first through fourth transistors.

4. The semiconductor memory device according to claim 2 comprising an electrode film, the electrode film including:
a first part comprising a gate electrode of the first transistor;
a second part comprising a gate electrode of the third transistor; and
a connecting part connected to the first part and the second part.

5. The semiconductor memory device according to claim 2, comprising:
fifth through eighth conductive layers aligned in the first direction and provided separated from the first through fourth conductive layers in the second direction or the third direction;
a second semiconductor column extending in the first direction and facing the fifth through eighth conductive layers; and
a second insulating film provided between the fifth through eighth conductive layers and the second semiconductor column,
wherein the plurality of transistors comprise:
a fifth transistor that is electrically connected to the fifth conductive layer;
a sixth transistor that is electrically connected to the sixth conductive layer and is adjacent to the fifth transistor via the insulating region in the second direction;
a seventh transistor that is electrically connected to the seventh conductive layer and is adjacent to the fifth transistor and the sixth transistor via the insulating region in the third direction; and
an eighth transistor that is electrically connected to the eighth conductive layer and is adjacent to the fifth transistor and the sixth transistor via the insulating region in the third direction, and
one of the fifth through eighth transistors comprises a region common to one of the first through fourth transistors.

6. The semiconductor memory device according to claim 5, wherein
at a timing in a writing operation,
a first voltage is supplied to the first conductive layer,
a second voltage being smaller than the first voltage is supplied to the second conductive layer, and
a voltage of the fifth conductive layer becomes a third voltage being smaller than the second voltage.

7. The semiconductor memory device according to claim 5, wherein
the second transistor comprises a region common to the fifth transistor,
the plurality of transistors include:
a ninth transistor that comprises a region common to the second transistor and the fifth transistor; and
a tenth transistor that comprises a region common to the second transistor and the fifth transistor, and
the surface of the semiconductor substrate comprises:
a first semiconductor region extending in the second direction and including a channel region of the second transistor and the fifth transistor; and
a second semiconductor region extending in the third direction and including a channel region of the ninth transistor and the tenth transistor.

8. The semiconductor memory device according to claim 2, comprising
first through fourth contacts connected to the first through fourth transistors,
wherein the first through fourth contacts
are provided between gate electrodes of the first transistor and the second transistor in the second direction, and
are provided between gate electrodes of the third transistor and the fourth transistor in the third direction.

9. The semiconductor memory device according to claim 8, comprising
the first conductive layer electrically connected to the first transistor via the first contact,
the second conductive layer electrically connected to the second transistor via the second contact,
the third conductive layer electrically connected to the third transistor via the third contact, and
the fourth conductive layer electrically connected to the fourth transistor via the fourth contact.

10. The semiconductor memory device according to claim 2, wherein
the surface of the semiconductor substrate comprises:
a third semiconductor region extending in the second direction; and
a fourth semiconductor region extending in the third direction and intersecting the first semiconductor region, and
the semiconductor memory device comprises:
a fifth contact and a sixth contact provided in one end section and the other end section of the third semiconductor region in the second direction;
a seventh contact and an eighth contact provided in one end section and the other end section of the fourth semiconductor region in the third direction;
a ninth contact provided in a portion where the third semiconductor region and the fourth semiconductor region intersect;
a first gate electrode provided between the fifth contact and the ninth contact;
a second gate electrode provided between the sixth contact and the ninth contact;
a third gate electrode provided between the seventh contact and the ninth contact; and
a fourth gate electrode provided between the eighth contact and the ninth contact.

11. The semiconductor memory device according to claim 10, comprising
a voltage generation circuit,
wherein the voltage generation circuit is electrically connected to the portion where the third semiconductor region and the fourth semiconductor region intersect, via the ninth contact.

12. The semiconductor memory device according to claim 2, comprising:
ninth through twelfth conductive layers aligned in the first direction and provided adjacent to the first through fourth conductive layers in the second direction or the third direction;
a third semiconductor column extending in the first direction and facing the ninth through twelfth conductive layers; and
a third insulating film provided between the ninth through twelfth conductive layers and the third semiconductor column, wherein the plurality of transistors comprise:
an eleventh transistor that is electrically connected to the ninth conductive layer;

a twelfth transistor that is electrically connected to the tenth conductive layer and is adjacent to the eleventh transistor via the insulating region in the second direction;

a thirteenth transistor that is electrically connected to the eleventh conductive layer and is adjacent to the eleventh transistor and the twelfth transistor via the insulating region in the third direction; and a fourteenth transistor that is electrically connected to the twelfth conductive layer and is adjacent to the eleventh transistor and the twelfth transistor via the insulating region in the third direction, and none of the eleventh through fourteenth transistors comprises a region common to any of the first through fourth transistors.

13. A semiconductor memory device comprising:

a semiconductor substrate;

a first memory block and a second memory block that are provided separated from the semiconductor substrate in a first direction intersecting a surface of the semiconductor substrate, and are aligned in a second direction intersecting the first direction; and a plurality of transistors that are provided on the surface of the semiconductor substrate, and are aligned in a third direction intersecting the first direction and the second direction, the first memory block comprising:

a plurality of first conductive layers aligned in the first direction;

a first semiconductor column extending in the first direction and facing the plurality of first conductive layers; and a first insulating film provided between the plurality of first conductive layers and the first semiconductor column, the second memory block comprising:

a plurality of second conductive layers aligned in the first direction;

a second semiconductor column extending in the first direction and facing the plurality of second conductive layers; and a second insulating film provided between the plurality of second conductive layers and the second semiconductor column, and the plurality of transistors including:

a first transistor that is electrically connected to one of the plurality of first conductive layers;

a second transistor that is electrically connected to one of the plurality of second conductive layers;

a third transistor that is electrically connected to one of the plurality of first conductive layers and is provided between the first transistor and the second transistor; and a fourth transistor that is electrically connected to one of the plurality of second conductive layers and is provided between the first transistor and the third transistor.

14. The semiconductor memory device according to claim 13, wherein the plurality of transistors include:

a fifth transistor that is electrically connected to one of the plurality of first conductive layers and is adjacent to the first transistor via an insulating region;

a sixth transistor that is electrically connected to one of the plurality of second conductive layers and is adjacent to the second transistor via the insulating region;

a seventh transistor that is electrically connected to one of the plurality of first conductive layers and is adjacent to the third transistor via the insulating region; and an eighth transistor that is electrically connected to one of the plurality of second conductive layers and is adjacent to the fourth transistor via the insulating region.

15. The semiconductor memory device according to claim 14, wherein the fifth transistor is adjacent to the fourth transistor via the insulating region, and a distance in the third direction between the first transistor and the fifth transistor is smaller than a distance in the third direction between the fourth transistor and the fifth transistor.

16. The semiconductor memory device according to claim 13, comprising:

a ninth transistor that is adjacent to the first transistor via an insulating region in the second direction;

a tenth transistor that is adjacent to the second transistor via the insulating region in the second direction;

an eleventh transistor that is adjacent to the third transistor via the insulating region in the second direction; and a twelfth transistor that is adjacent to the fourth transistor via the insulating region in the second direction, wherein the ninth transistor is electrically connected to one of the plurality of first conductive layers;

the tenth transistor is electrically connected to one of the plurality of second conductive layers;

the eleventh transistor is electrically connected to one of the plurality of first conductive layers;

the twelfth transistor is electrically connected to one of the plurality of second conductive layers.

17. The semiconductor memory device according to claim 13, comprising:

a first chip; and a second chip connected to the first chip, the first chip comprising:

the first memory block and the second memory block; and a plurality of first pad electrodes connected to the first memory block and the second memory block, the second chip comprising:

the semiconductor substrate and the plurality of transistors; and a plurality of second pad electrodes connected to the plurality of transistors, wherein the first chip and the second chip are provided such that the plurality of first pad electrodes face the plurality of second pad electrodes; and the plurality of first pad electrodes are connected to the plurality of second pad electrodes.

* * * * *